US012652853B2

(12) United States Patent
Pan et al.

(10) Patent No.: US 12,652,853 B2
(45) Date of Patent: Jun. 9, 2026

(54) SEMICONDUCTOR STRUCTURE HAVING PLURALITY OF FIN SEGMENTS AND METHOD FOR FORMING THE SAME

(71) Applicant: Taiwan Semiconductor Manufacturing Company, Ltd., Hsinchu (TW)

(72) Inventors: Kuan-Ting Pan, Taipei City (TW); Kuo-Cheng Chiang, Zhubei City (TW); Shi-Ning Ju, Hsinchu City (TW); Jin Cai, Hsinchu City (TW); Chih-Hao Wang, Baoshan Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 720 days.

(21) Appl. No.: 18/152,448

(22) Filed: Jan. 10, 2023

(65) Prior Publication Data

US 2024/0234501 A1     Jul. 11, 2024

(51) Int. Cl.
| | |
|---|---|
| *H10D 84/01* | (2026.01) |
| *H10D 30/67* | (2025.01) |
| *H10D 62/10* | (2025.01) |
| *H10D 64/01* | (2025.01) |
| *H10D 84/03* | (2025.01) |

(52) U.S. Cl.
CPC ..... *H10D 84/0158* (2025.01); *H10D 30/6735* (2025.01); *H10D 62/121* (2025.01); *H10D 64/017* (2025.01); *H10D 84/038* (2025.01)

(58) Field of Classification Search
CPC ..... H10D 30/0273; H10D 30/501–509; H10D 30/62; H10D 30/6735; H10D 62/113; H10D 62/117; H10D 62/121; H10D 62/124; H10D 64/017; H10D 84/01; H10D 84/0151; H10D 84/0158; H10D 84/02; H10D 84/032; H10D 84/035; H10D 84/038; H10D 84/05; H10D 84/07; H10D 84/08
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |

(Continued)

*Primary Examiner* — Cheung Lee
(74) *Attorney, Agent, or Firm* — Birch, Stewart, Kolasch & Birch, LLP

(57) ABSTRACT

A method for forming a semiconductor structure is provided. The method includes forming a first plurality of strip patterns and a second plurality of strip patterns that extend over an epitaxial stack in a first horizontal direction and are alternately arranged in a second horizontal direction perpendicular to the first horizontal direction. The method further includes patterning the first plurality of strip patterns to form a first plurality of island patterns, and patterning the second plurality of strip patterns to form a second plurality of island patterns. The first plurality of island patterns and the second plurality of island patterns are alternately arranged in the second horizontal direction. The method further includes etching the epitaxial stack using the first plurality of island patterns and second plurality of island patterns, thereby forming a fin structure.

20 Claims, 39 Drawing Sheets

(56)                    References Cited

U.S. PATENT DOCUMENTS

| | | | | |
|---|---|---|---|---|
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2021/0273075 | A1* | 9/2021 | Pan ...................... | H10D 84/038 |
| 2022/0068716 | A1* | 3/2022 | Pan ...................... | H10D 84/038 |

* cited by examiner

SEMICONDUCTOR STRUCTURE HAVING PLURALITY OF FIN SEGMENTS AND METHOD FOR FORMING THE SAME

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2A-1 is a cross-sectional view of the semiconductor structure at an intermediate stage corresponding to line X-X of FIG. 2A, in accordance with some embodiments of the disclosure.

FIG. 2B-1 is a cross-sectional view of the semiconductor structure at an intermediate stage corresponding to line X-X of FIG. 2B, in accordance with some embodiments of the disclosure.

FIGS. 2C-1, 2C-2, 2C-3, 2C-4 and 2C-5 are cross-sectional views of the semiconductor structure at an intermediate stage corresponding to line X-X, line Y1-Y1, line Y2-Y2, line Y3-Y3 and line Y4-Y4 of FIG. 2C, in accordance with some embodiments of the disclosure.

FIGS. 2D-1, 2D-2, 2D-3, 2D-4 and 2D-5 are cross-sectional views of the semiconductor structure at an intermediate stage corresponding to line X-X, line Y1-Y1, line Y2-Y2, line Y3-Y3 and line Y4-Y4 of FIG. 2D, in accordance with some embodiments of the disclosure.

FIGS. 2E-1, 2E-2, 2E-3, 2E-4 and 2E-5 are cross-sectional views of the semiconductor structure at an intermediate stage corresponding to line X-X, line Y1-Y1, line Y2-Y2, line Y3-Y3 and line Y4-Y4 of FIG. 2E, in accordance with some embodiments of the disclosure.

FIGS. 2F-1, 2F-2, 2F-3, 2F-4 and 2F-5 are cross-sectional views of the semiconductor structure at an intermediate stage corresponding to line X-X, line Y1-Y1, line Y2-Y2, line Y3-Y3 and line Y4-Y4 of FIG. 2F, in accordance with some embodiments of the disclosure.

FIGS. 2G-1, 2G-2, 2G-3, 2G-4 and 2G-5 are cross-sectional views of the semiconductor structure at an intermediate stage corresponding to line X-X, line Y1-Y1, line Y2-Y2, line Y3-Y3 and line Y4-Y4 of FIG. 2G, in accordance with some embodiments of the disclosure.

FIG. 2G-6 is an enlarged view of FIG. 2G to illustrate more detail of an active region, in accordance with some embodiments of the disclosure.

FIGS. 2H-1, 2H-2, 2H-3 and 2H-4 are cross-sectional views of the semiconductor structure at an intermediate stage corresponding to line X-X, line Y5-Y5, line Y6-Y6, and line Y7-Y7 of FIG. 2H, in accordance with some embodiments of the disclosure.

FIGS. 2K-1, 2K-2, 2K-3 and 2K-4 are cross-sectional views of the semiconductor structure at an intermediate stage corresponding to line X-X, line Y5-Y5, line Y6-Y6, and line Y7-Y7 of FIG. 2K, in accordance with some embodiments of the disclosure.

FIGS. 2L-1, 2L-2, 2l-3 and 2L-4 are cross-sectional views of the semiconductor structure at an intermediate stage corresponding to line X-X, line Y5-Y5, line Y6-Y6, and line Y7-Y7 of FIG. 2K, in accordance with some embodiments of the disclosure.

FIGS. 2M-1, 2M-2, 2M-3 and 2M-4 are cross-sectional views of the semiconductor structure at an intermediate stage corresponding to line X-X, line Y5-Y5, line Y6-Y6, and line Y7-Y7 of FIG. 2M, in accordance with some embodiments of the disclosure.

FIG. 2M-5 is an enlarged view of FIG. 2M to illustrate more detail of an active region and neighboring components, in accordance with some embodiments of the disclosure.

DETAILED DESCRIPTION

Figure 1:
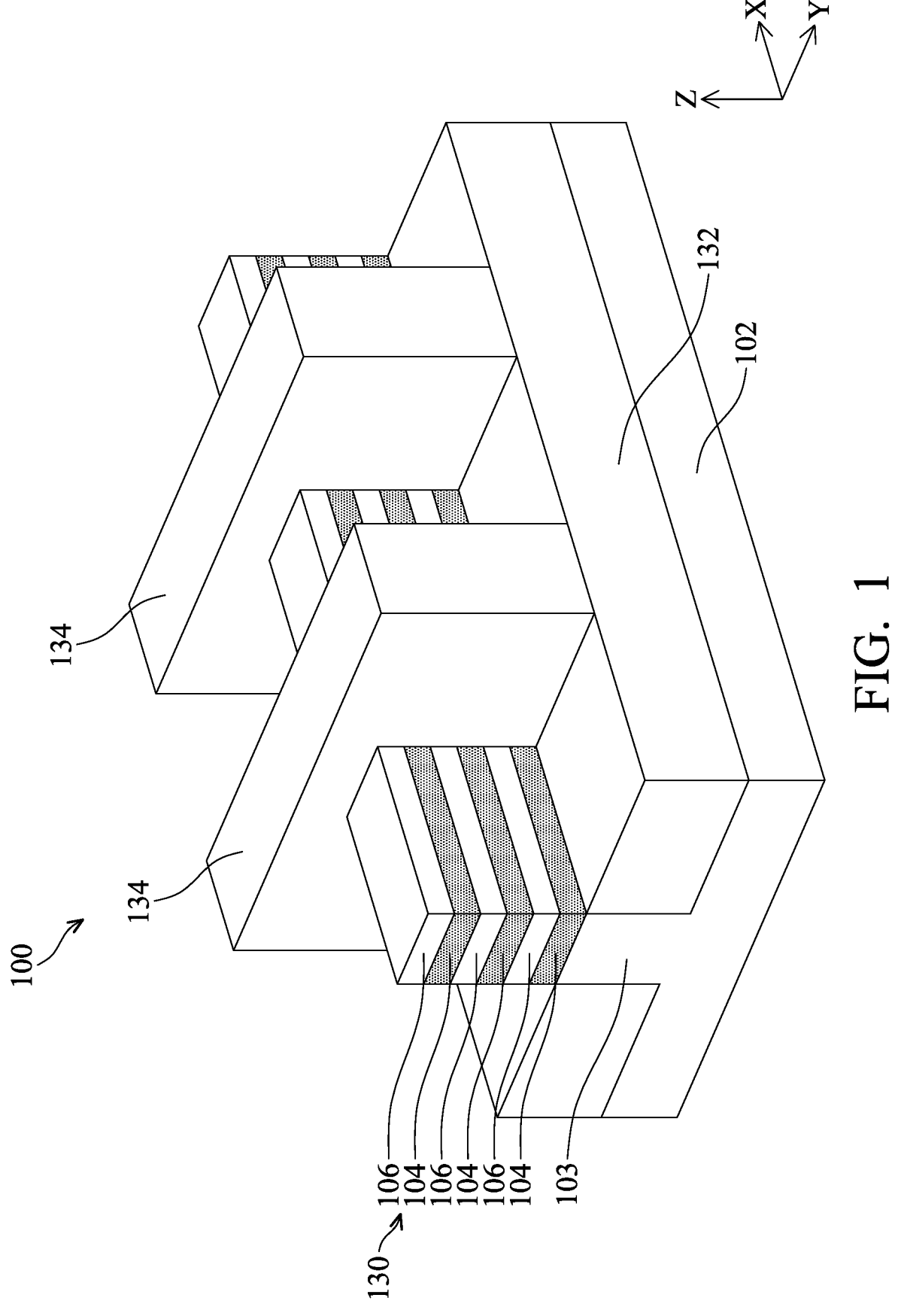
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

A semiconductor structure with CNOD (continuous oxide definition, i.e., continuous active region) design may facilitate to improvement of the circuit density. Devices requiring high on-state current are formed on wider active regions (e.g., fin structures and/or nanostructure) while devices requiring low on-state current are formed on narrower active regions. Therefore, the active regions with segments of different widths can simultaneously meet the performance requirements of the different devices and improve the circuit density.

Embodiments of a semiconductor structure are provided. The aspect of the present disclosure is directed to forming an active region (e.g., a fin structure) with segments of different widths. In accordance with the embodiments of the present disclosure, the hard mask patterns for forming the active regions are formed by patterning the two sets of strip patterns with a great difference in etching selectivity using two photolithography processes. As a result, the transition portions of the photoresist patterns may be not transferred into the active regions. Therefore, the circuit density of the resulting semiconductor device may be improved. Furthermore, the power consumption of the resulting semiconductor devices may be reduced, and the performance of the resulting semiconductor devices may be enhanced.

FIG. 1 is a perspective view of a semiconductor structure 100, in accordance with some embodiments of the disclosure.

The semiconductor structure 100 includes a fin structure 130 and an isolation structure 132 over the substrate 102, as shown in FIG. 1, in accordance with some embodiments. For a better understanding of the semiconductor structure 100, the X-Y-Z coordinate reference is provided in the figures of the present disclosure. The X-axis and the Y-axis are generally orientated along the lateral (or horizontal) directions that are parallel to the main surface (e.g., top surface) of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The fin structure 130 includes a lower fin element 103 surrounded by the isolation structure 132, and an upper fin element formed from an epitaxial stack including alternating first semiconductor layers 104 and second semiconductor layers 106, in accordance with some embodiments. The second semiconductor layers 106 will form nanostructures (e.g., nanowires or nanosheets) and serve as the channel for the resulting semiconductor devices, in accordance with some embodiments.

The fin structure 130 extends in the X direction, in accordance with some embodiments. That is, the fin structure 130 has a longitudinal axis parallel to the X direction, in accordance with some embodiments. The X direction may also be referred to as the channel-extending direction. The current of the resulting semiconductor device (i.e., nano-structure transistor) flows in the X direction through the channel. The fin structure 130 is defined as several channel regions and several source/drain regions, where the channel regions and the source/drain regions are alternately arranged, in accordance with some embodiments. In this disclosure, a source/drain refers to a source and/or a drain. It is noted that in the present disclosure, a source and a drain are interchangeably used and the structures thereof are substantially the same.

Gate structures 134 are formed with longitudinal axes parallel to the Y direction and extending across and/or surrounding the channel regions of the fin structure 130, in accordance with some embodiments. The source/drain regions of the fin structure 130 are exposed from the gate structures 134, in accordance with some embodiments. The Y direction may also be referred to as a gate-extending direction, in accordance with some embodiments.

FIGS. 2A through 2M-5 are schematic views illustrating the formation of a semiconductor structure 100 at various intermediate stages, in accordance with some embodiments of the disclosure.

FIGS. 2A through 2G-5 illustrate the formation of active regions 130A-130D of the semiconductor structure 100, in accordance with some embodiments. FIGS. 2A, 2B, 2C, 2D, 2E, 2F and 2G are plan views of the semiconductor structure 100. It should be noted that the plan views in the present disclosure only illustrate some components of the semiconductor structure 100 for illustrative purposes, some other components of the semiconductor structure 100 may be shown in the cross-sectional views.

FIGS. 2A-1, 2B-1, 2C-1, 2D-1, 2E-1, 2F-1 and 2G-1 are cross-sectional views corresponding to line X-X of FIGS. 2A, 2B, 2C, 2D, 2E, 2F and 2G. FIGS. 2C-2, 2D-2, 2E-2, 2F-2 and 2G-2 are cross-sectional views corresponding to line Y1-Y1 of FIGS. 2C, 2D, 2E, 2F and 2G. FIGS. 2C-3, 2D-3, 2E-3, 2F-3 and 2G-3 are cross-sectional views corresponding to line Y2-Y2 of FIGS. 2C, 2D, 2E, 2F and 2G. FIGS. 2C-4, 2D-4, 2E-4, 2F-4 and 2G-4 are cross-sectional views corresponding to line Y3-Y3 of FIGS. 2C, 2D, 2E, 2F and 2G. FIGS. 2C-5, 2D-5, 2E-5, 2F-5 and 2G-5 are cross-sectional views corresponding to line Y4-Y4 of FIGS. 2C, 2D, 2E, 2F and 2G.

Figure 2A:
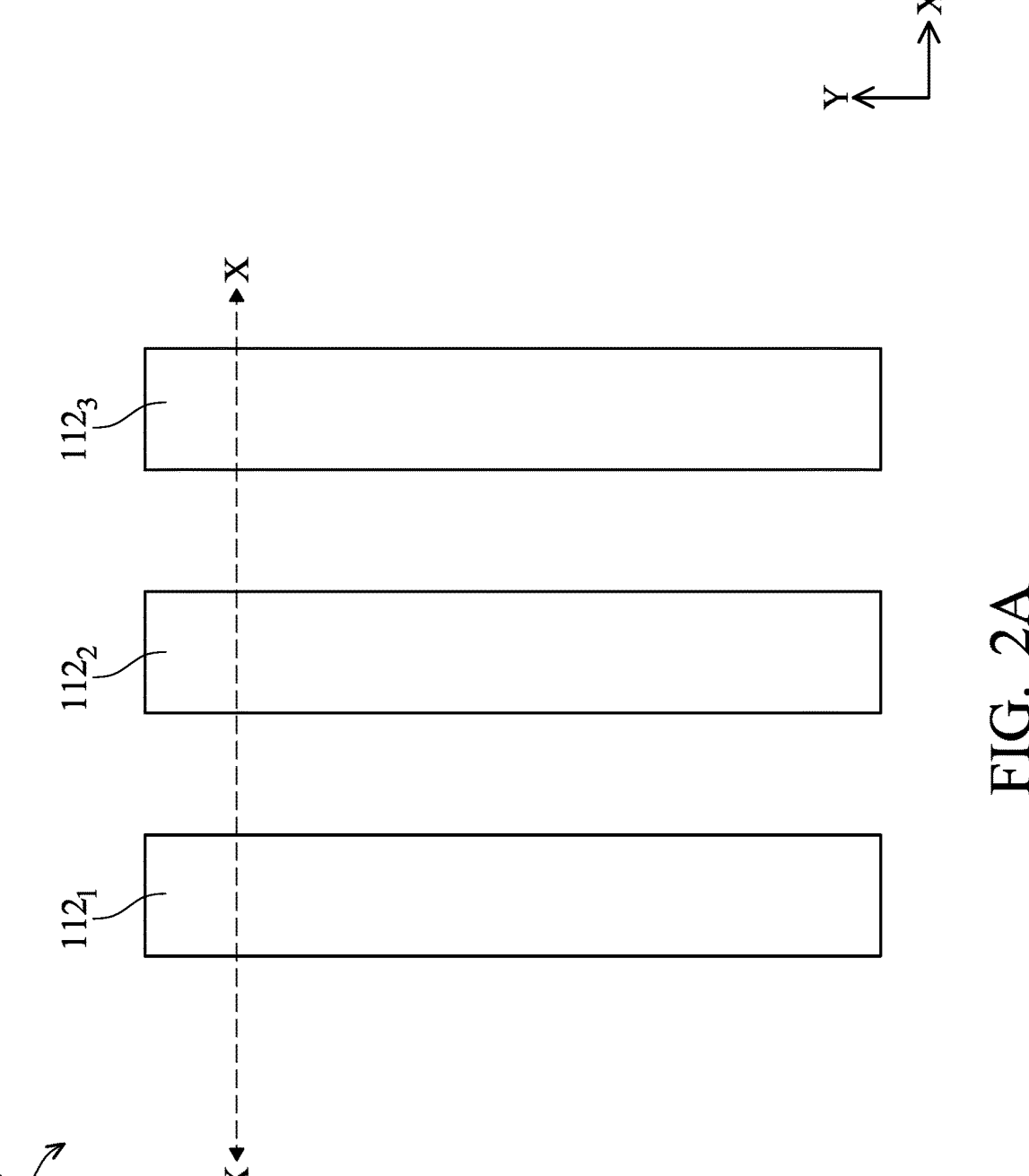
FIGS. 2A, 2B, 2C, 2D, 2E, 2F, 2G, 2H, 2K and 2M are plan views illustrating the formation of a semiconductor structure at various intermediate stages, in accordance with some embodiments of the disclosure.
Figures 1, 2A:
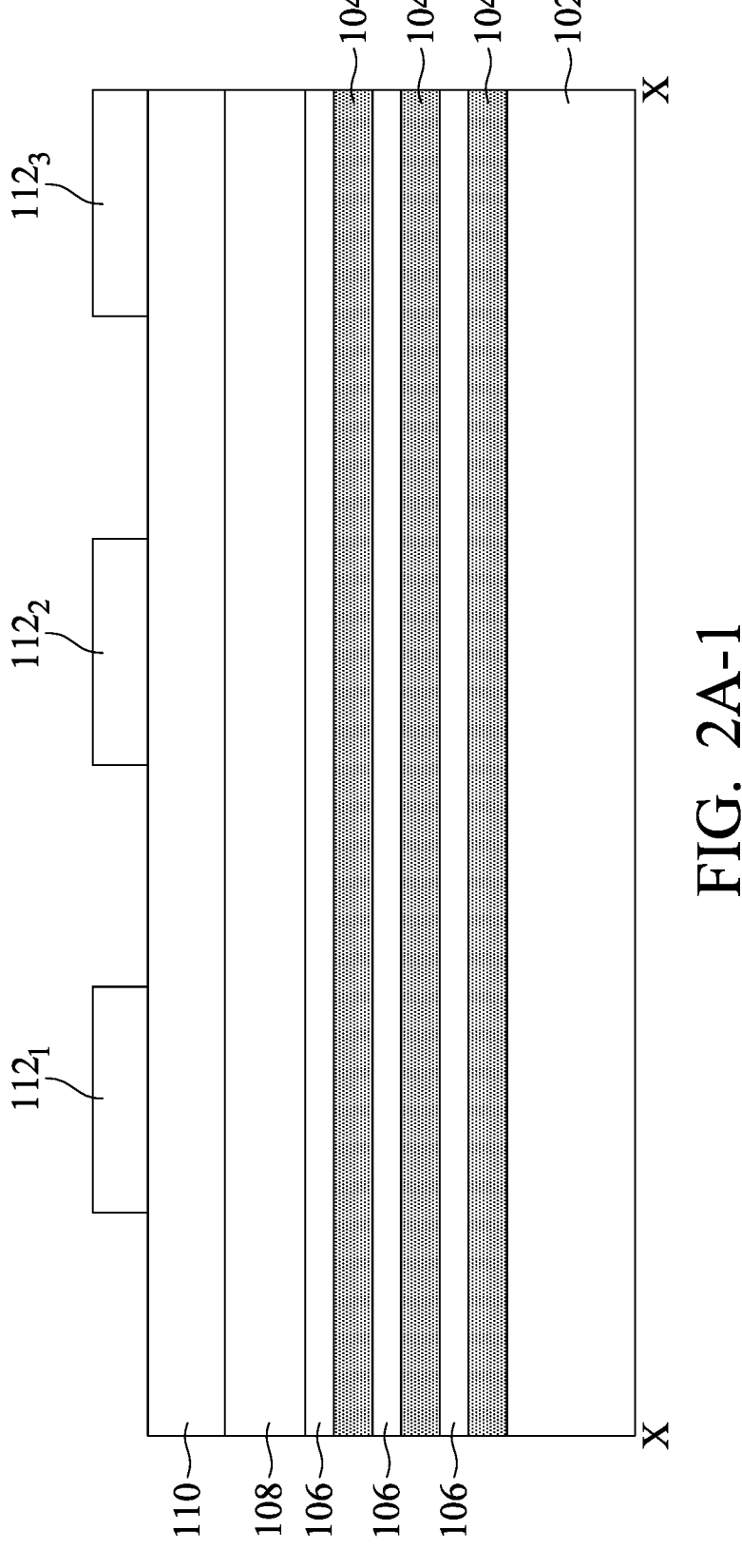

FIGS. 2A and 2A-1 illustrate a semiconductor structure 100 after the formation of an epitaxial stack, a first mask layer 108, a second mask layer 110, and first strip patterns 112, in accordance with some embodiments.

The semiconductor structure 100 includes a substrate 102 and an epitaxial stack over the substrate 102, as shown in FIG. 2A-1, in accordance with some embodiments. The epitaxial stack includes alternating first semiconductor layers 104 and second semiconductor layers 106, as shown in FIG. 2A-1, in accordance with some embodiments.

In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The first semiconductor layers 104 and the second semiconductor layers 106 are alternately formed over the substrate 102 using an epitaxial growth process, in accordance with some embodiments. The epitaxial growth process may be molecular beam epitaxy (MBE), metal organic chemical vapor deposition (MOCVD), or vapor phase epitaxy (VPE), or another suitable technique.

The first semiconductor layers 104 have a different lattice constant than the second semiconductor layers 106, in accordance with some embodiments. In some embodiments, the first semiconductor layers 104 and second semiconductor layers 106 have different oxidation rates and/or etching selectivity. In some embodiments, the first semiconductor layers 104 are made of SiGe, where the percentage of germanium (Ge) in the SiGe is in a range from about 20 atomic % to about 50 atomic %, and the second semiconductor layers 106 are made of pure or substantially pure silicon. In some embodiments, the first semiconductor layers 104 are $Si_{1-x}Ge_x$, where x is more than about 0.3, or Ge (x=1.0) and the second semiconductor layers 106 are Si or $Si_{1-y}Ge_y$, where y is less than about 0.4, and x>y. Although three first semiconductor layers 104 and three second semiconductor layers 106 are shown in FIGS. 2A-1, the number is not limited to three, and can be two or four, and is less than ten.

A first mask layer 108 is formed over the epitaxial stack, as shown in FIG. 2A-1, in accordance with some embodiments. In some embodiments, the first mask layer 108 is made of dielectric material such as silicon oxide ($SiO_2$), silicon oxynitride (SiON), silicon nitride (SiN), oxygen-doped silicon carbide (SiC:O), oxygen-doped silicon carbonitride (Si(O)CN), or another suitable dielectric material. In some embodiments, the first mask layer 108 is deposited using CVD (such as plasma-enhanced CVD (PECVD), low-pressure CVD (LPCVD), high density plasma CVD (HDP-CVD), flowable CVD (FCVD), or high aspect ratio process (HARP)), atomic layer deposition (ALD), another suitable technique, or a combination thereof.

A second mask layer 110 is formed over the first mask layer 108, as shown in FIG. 2A-1, in accordance with some embodiments. In some embodiments, the second mask layer 110 is made of dielectric material such as silicon nitride (SiN), silicon oxynitride (SiON), silicon oxide ($SiO_2$), oxygen-doped silicon carbide (SiC:O), oxygen-doped silicon carbonitride (Si(O)CN), or another suitable dielectric material. In some embodiments, the first mask layer 108 and the second mask layer 110 are made of different materials and have a great difference in etching selectivity. For example, the first mask layer 108 is made of SiO, and the second mask layer 110 is made of SiN. In some embodiments, the second mask layer 110 is deposited using CVD (such as PECVD, LPCVD, HDP-CVD, FCVD, or HARP), ALD, another suitable technique, or a combination thereof.

First strip patterns 112 (including $112_1$, $112_2$ and $112_3$) are formed over the second mask layer 110, as shown in FIGS. 2A and 2A-1, in accordance with some embodiments. The first strip patterns 112 extend in the Y direction, in accordance with some embodiments. The first strip patterns $112_1$, $112_2$ and $112_3$ are spaced apart from one another and arranged in the X direction.

In some embodiments, the first strip patterns 112 are made of silicon-containing dielectric material such as silicon nitride (SiN), silicon oxynitride (SiON), silicon oxide ($SiO_2$), oxygen-doped silicon carbide (SiC:O), oxygen-doped silicon carbonitride (Si(O)CN), zinc oxide (ZnO); metal oxide such as aluminum oxide ($Al_2O_3$), tin oxide (SnO), lead oxide (PbO), beryllium oxide (BeO), chromium oxide (CrO, $Cr_2O_3$, $Cr_2O_3$ or $Cr_3O_4$); semiconductor material such as silicon (Si) or silicon germanium (SiGe); and/or a combination thereof. In some embodiments, the first strip patterns 112 and the first mask layer 108 are made of different materials and have a great difference in etching selectivity.

In some embodiments, the formation of the first strip patterns 112 includes depositing a material for the first strip patterns 112, and patterning the material for the first strip patterns 112. The patterning process includes forming photoresist patterns over (not shown) the material for the first strip patterns 112 using a photolithography process, and etching the material for the first strip patterns 112 until the second mask layer 110 is exposed, in accordance with some embodiments. The etching process may be an anisotropic etching process such as dry plasma etching.

Figure 2B:
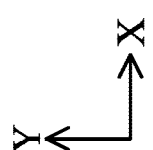
Figure 2B:
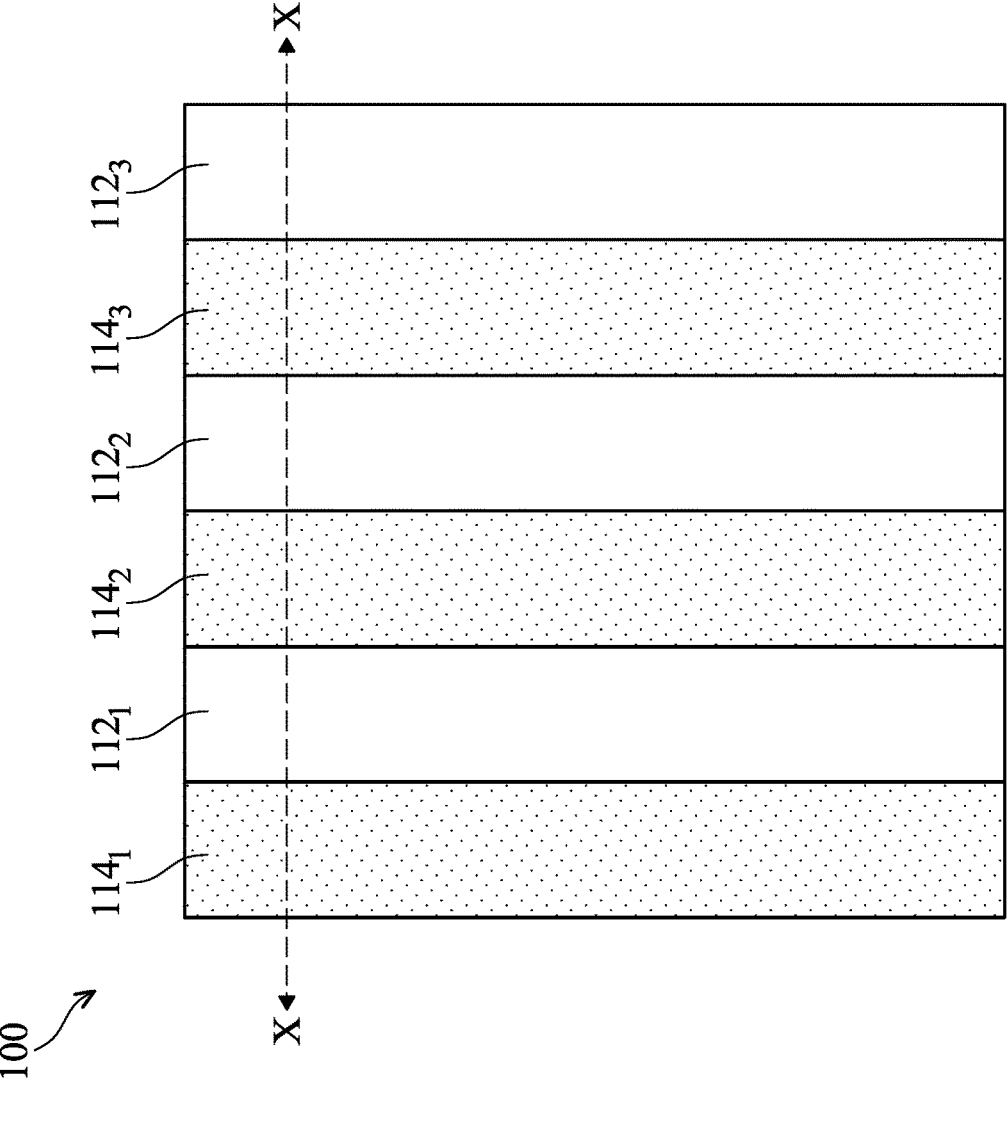
Figures 1, 2B:
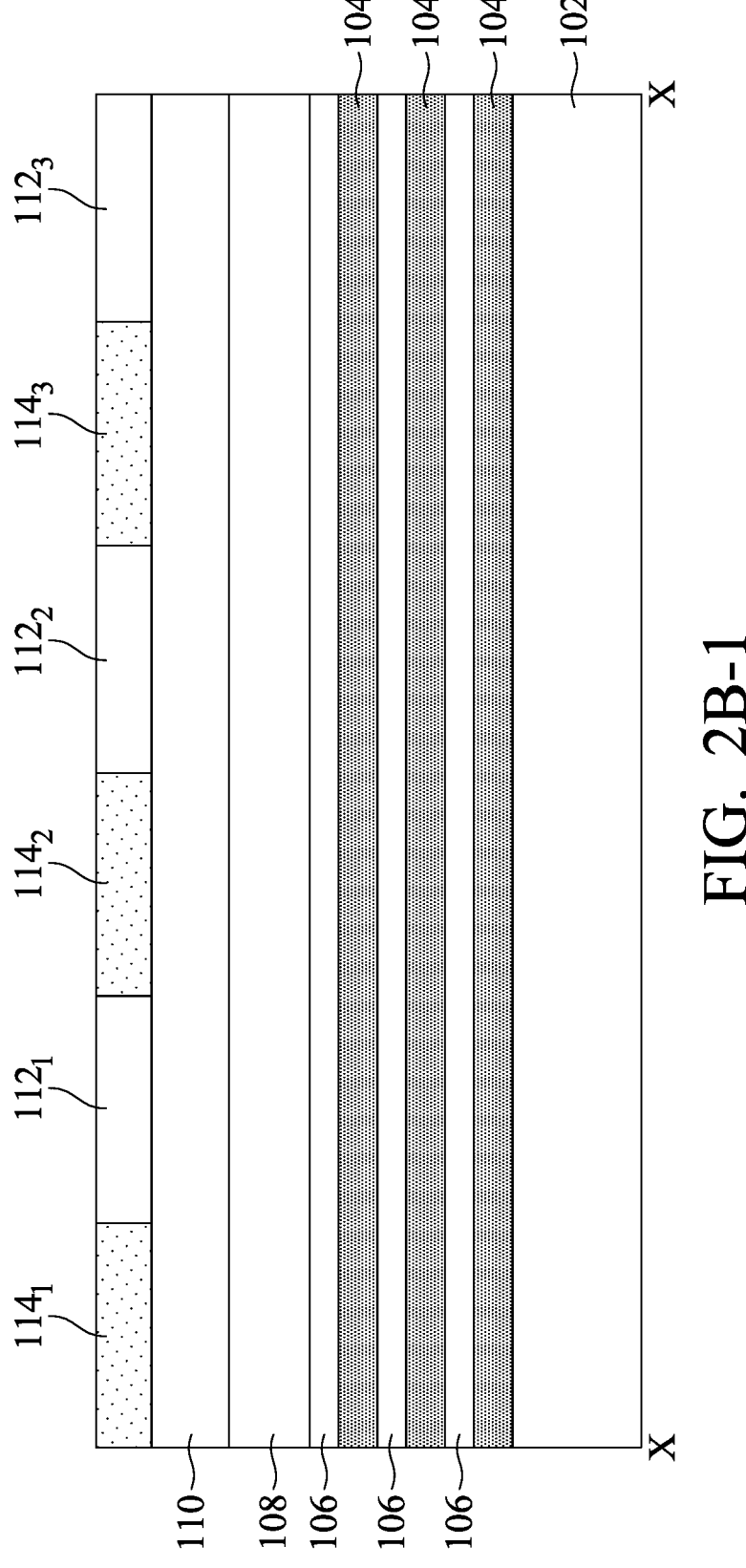

FIGS. 2B and 2B-1 illustrate a semiconductor structure 100 after the formation of second strip patterns 114, in accordance with some embodiments.

Second strip patterns 114 (including $114_1$, $114_2$ and $114_3$) are formed over the second mask layer 110, as shown in FIGS. 2B and 2B-1, in accordance with some embodiments. The second strip patterns 114 extend in the Y direction, in accordance with some embodiments. The second strip patterns $114_1$, $114_2$ and $114_3$ and the first strip patterns $112_1$, $112_2$ and $112_3$ are alternatingly arranged in the X direction. In some embodiments, the first strip patterns 112 and the second strip patterns 114 are collectively referred to as a third mask layer.

In some embodiments, the second strip patterns $114_1$, $114_2$ and $114_3$ have substantially the same width (in the X direction) as the first strip patterns $112_1$, $112_2$ and $112_3$. In some embodiments, the width of the first strip patterns 112 and the second strip patterns 114 may be from above 1.5 to about 5 times the pitch of dummy gate structures.

In some embodiments, the second strip patterns 114 are made of silicon-containing dielectric material such as silicon nitride (SiN), silicon oxynitride (SiON), silicon oxide ($SiO_2$), oxygen-doped silicon carbide (SiC:O), oxygen-doped silicon carbonitride (Si(O)CN), zinc oxide (ZnO); metal oxide such as aluminum oxide ($Al_2O_3$), tin oxide (SnO), lead oxide (PbO), beryllium oxide (BeO), chromium oxide (CrO, $Cr_2O_3$, $Cr_2O_3$ or $Cr_3O_4$); semiconductor material such as silicon (Si) or silicon germanium (SiGe); and/or a combination thereof. In some embodiments, the second strip patterns 114 and the first strip patterns 112 are made of different materials and have a great difference in etching selectivity. In addition, the second strip patterns 114 and the first mask layer 108 are made of different materials and have a great difference in etching selectivity. In an embodiment, the first mask layer 108 is made of SiO, the first strip patterns 112 are made of SiN, and the second strip patterns 114 are made of Si.

In some embodiments, the formation of the second strip patterns 114 includes depositing a material for the second strip patterns 114 to overfill the trenches between the first strip patterns 112, and planarizing the material for the second strip patterns 114 until the first strip patterns 112 are exposed. The planarization process may be chemical mechanical polishing (CMP), etching back process, or a combination thereof. In some embodiments, the top surfaces of the first strip patterns 112 and the top surfaces of the first strip patterns 112 are substantially coplanar.

Figure 2C:
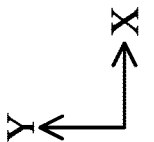
Figures 1, 2, 2C, 3:
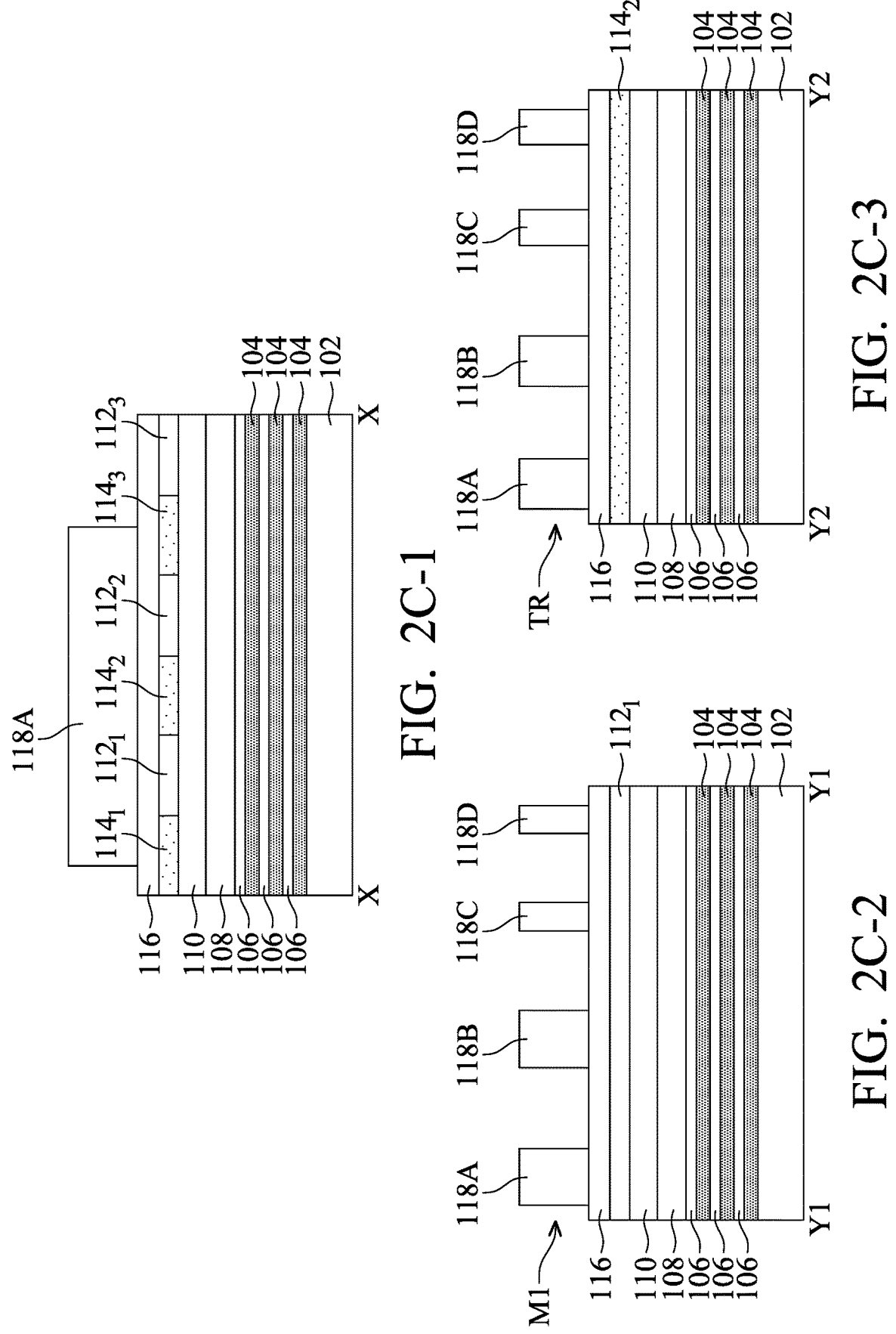
Figures 2, 2C, 3, 4, 5:
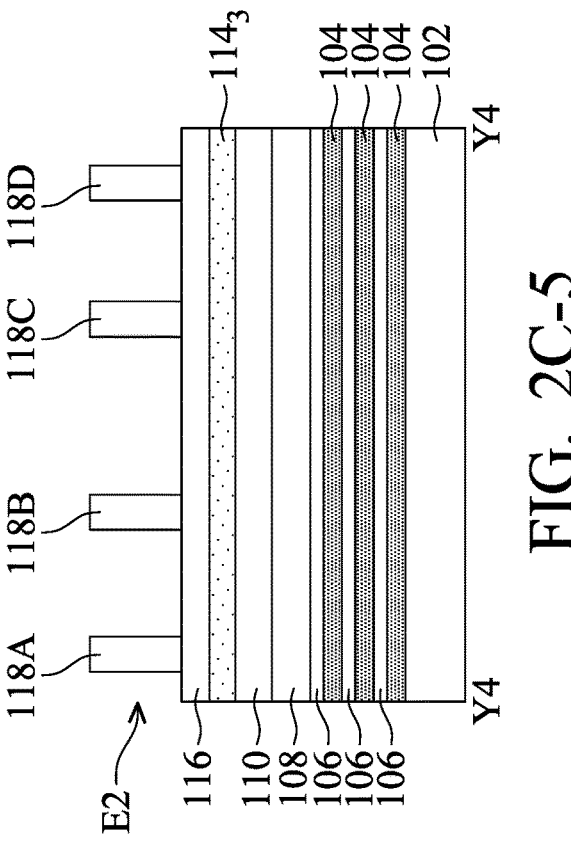
Figures 2, 2C, 3, 4:
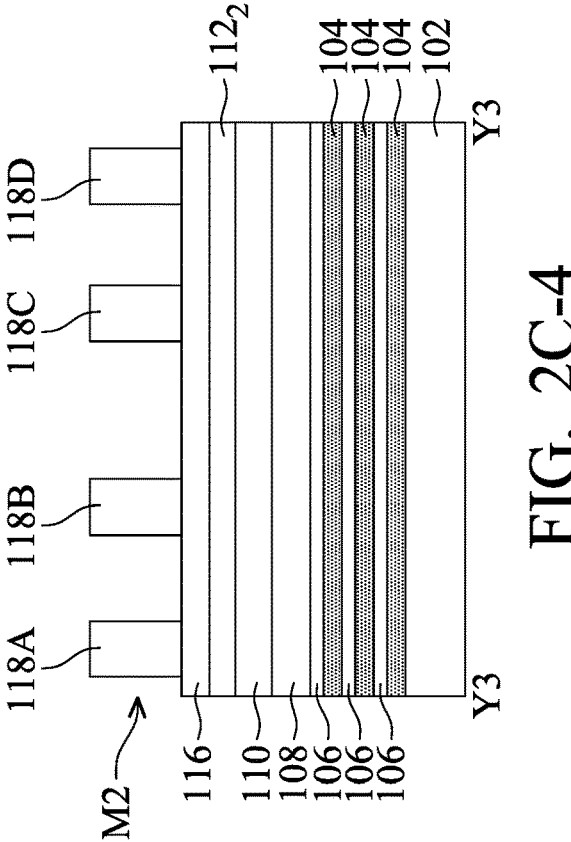

FIGS. 2C through 2C-5 illustrate a semiconductor structure 100 after the formation of a fourth mask layer 116 and first photoresist patterns 118, in accordance with some embodiments.

A fourth mask layer 116 is formed over the third mask layer (including the first strip patterns 112 and the second strip patterns 114), as shown in FIGS. 2C-1 through 2C-5, in accordance with some embodiments. In some embodiments, the fourth mask layer 116 is made of bottom anti-reflective coating (BARC) material such as an inorganic material (e.g., SiON, SiOC, carbon, and/or another suitable material) or an organic material (e.g., polymer, oligomer, or monomer).

First photoresist patterns 118 (including 118A, 118B, 118C and 118D) are formed over the fourth mask layer 116, as shown in FIGS. 2C through 2C-5, in accordance with some embodiments. The first photoresist patterns 118A, 118B 118C and 118D extend in the X direction and are arranged in the Y direction, in accordance with some embodiments. The first photoresist patterns 118A, 118B 118C and 118D have longitudinal axes parallel to the X direction, in accordance with some embodiments. That is, the dimensions (lengths) of the first photoresist patterns 118A, 118B 118C and 118D in the X direction are greater than the dimensions (widths) of the first photoresist patterns 118A, 118B 118C and 118D in the Y direction.

The first photoresist patterns 118 are formed by a photolithography process, in accordance with some embodiments. The photolithography process can include forming a photoresist layer (for example, by spin coating), performing a pre-exposure baking process, performing an exposure process using a mask (or a reticle), performing a post-exposure baking process, and performing a developing process. During the exposure process, the photoresist layer is exposed to radiation energy (such as ultraviolet (UV) light, deep UV (DUV) light, or extreme UV (EUV) light), where the mask blocks, transmits, and/or reflects radiation to the photoresist layer depending on a mask pattern of the mask and/or mask type, such that an image is projected onto the photoresist layer that corresponds with the mask pattern. Since the photoresist layer is sensitive to radiation energy, exposed portions of the resist layer chemically change, and exposed (or non-exposed) portions of the resist layer are dissolved during the developing process depending on the characteristics of the resist layer and the characteristics of the developing solution used in the developing process. After development, the patterned photoresist layer forms the first photoresist patterns 118A-118D which includes a resist pattern that corresponds with the mask.

Each of the first photoresist patterns 118A, 118B 118C and 118D includes a first edge portion E1, a first middle portion M1, a transition portion TR, a second middle portion M2, and a second edge portion E2, as shown in FIGS. 2C through 2C-5, in accordance with some embodiments. The first edge portion E1 overlaps the second strip pattern $114_1$, the first middle portion M1 overlaps the first strip pattern $112_1$, the transition portion TR overlaps the second strip pattern $114_1$, the second middle portion M2 overlaps the first strip pattern $112_2$, and the second edge portion E2 overlaps the second strip pattern $114_3$, in accordance with some embodiments.

The width (the dimension in the Y direction) of the first middle portion M1 of each of the first photoresist patterns 118A, 118B 118C and 118D is different than the width (the dimension in the Y direction) of the second middle portion M2 of the first middle portion M1 of each of the first photoresist patterns 118A, 118B 118C and 118D, as shown in FIG. 2C. in accordance with some embodiments.

For example, the first middle portion M1 of the first photoresist pattern 118A is wider than the second middle portion M2 of the first photoresist pattern 118A. The first middle portion M1 of the first photoresist pattern 118B is wider than the second middle portion M2 of the first photoresist pattern 118B.

For example, the first middle portion M1 of the first photoresist pattern 118C is narrower than the second middle portion M2 of the first photoresist pattern 118C. The first middle portion M1 of the first photoresist pattern 118D is narrower than the second middle portion M2 of the first photoresist pattern 118D.

The opposites sidewalls of the first middle portion M1 may be not aligned with the opposite sidewalls of the second middle portion M2, e.g., the first middle portion M1 and the second middle portion M2 of the first photoresist patterns 118B and 118C, as shown in FIG. 2C, in accordance with some embodiments.

One of the opposite sidewalls of the first middle portion M1 is aligned with one of the opposite sidewalls of the second middle portion M2, while another sidewall of the first middle portion M1 is not aligned with another sidewall of the second middle portion M2, e.g., the first middle portion M1 and the second middle portion M2 of the first photoresist patterns 118A and 118D, as shown in FIG. 2C, in accordance with some embodiments.

The transition portion TR is located between and connected to the first middle portion M1 and the second middle portion M2, as shown in FIG. 2C, in accordance with some embodiments. The transition portion TR is used to transition the width difference between the first middle portion M1 and the second middle portion M2, in accordance with some embodiments. Because of the characteristics of the photolithography process, the transition portion TR may have curved sidewall(s) (e.g., smiling profile) at the locations where the sidewall of the first middle portion M1 is not aligned with the sidewall of the second middle portion M2.

Figure 2D:
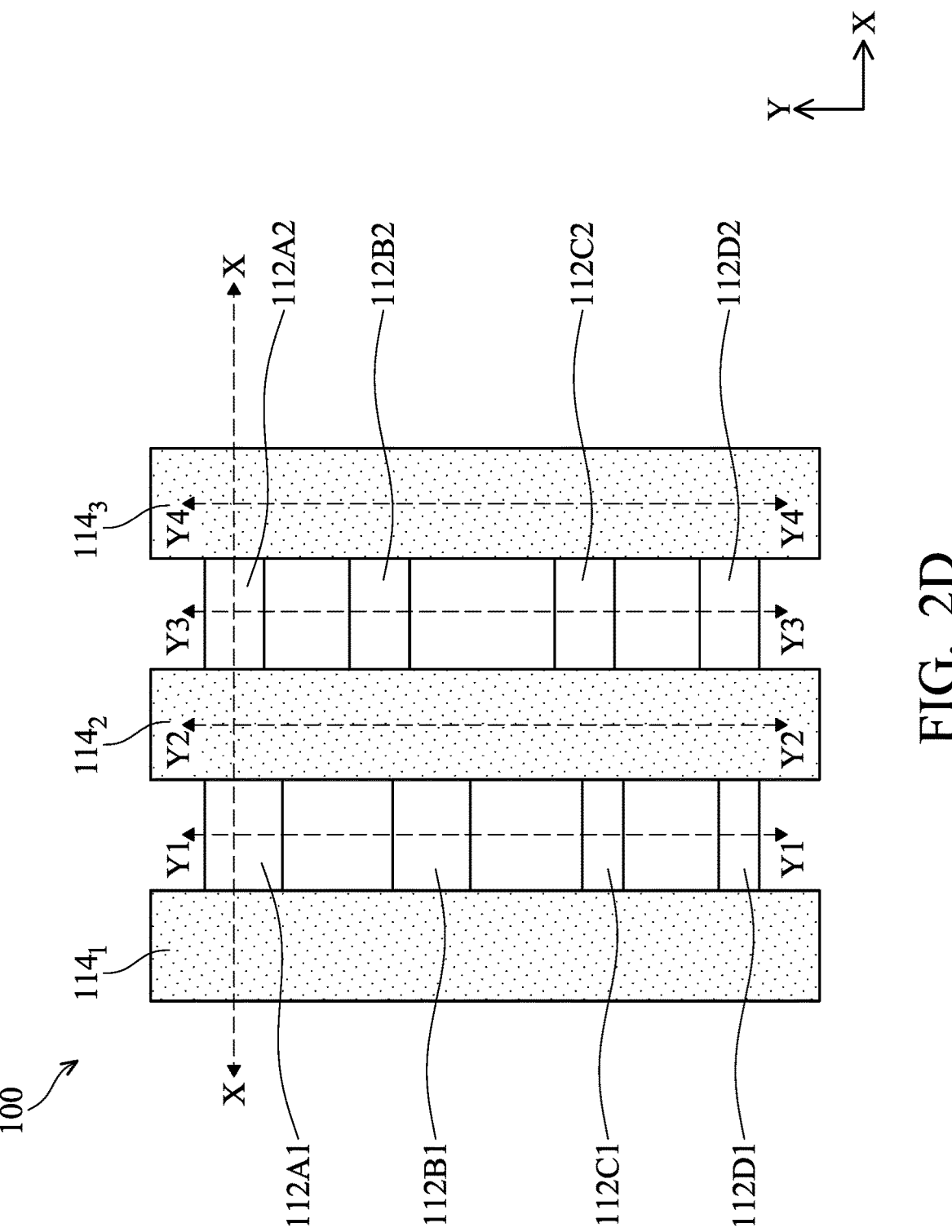
Figures 1, 2, 2D, 3:
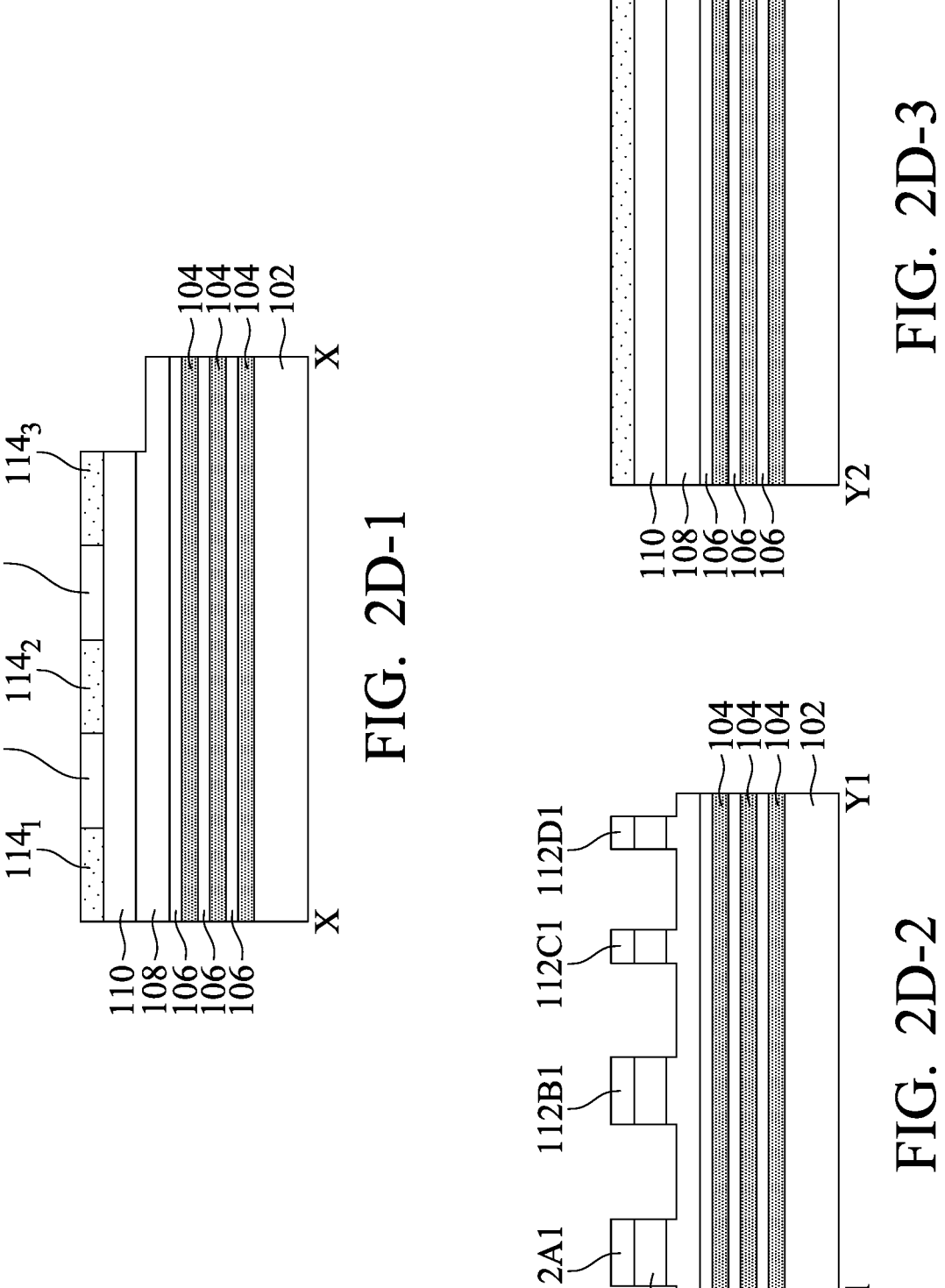
Figures 2, 2D, 3, 4, 5:
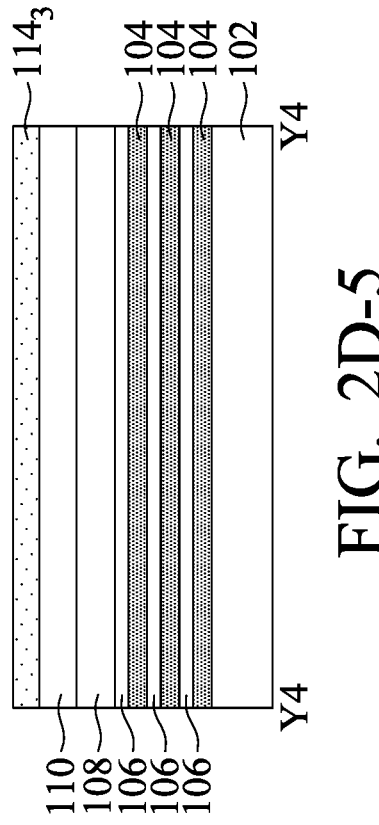
Figures 2, 2D, 3, 4:
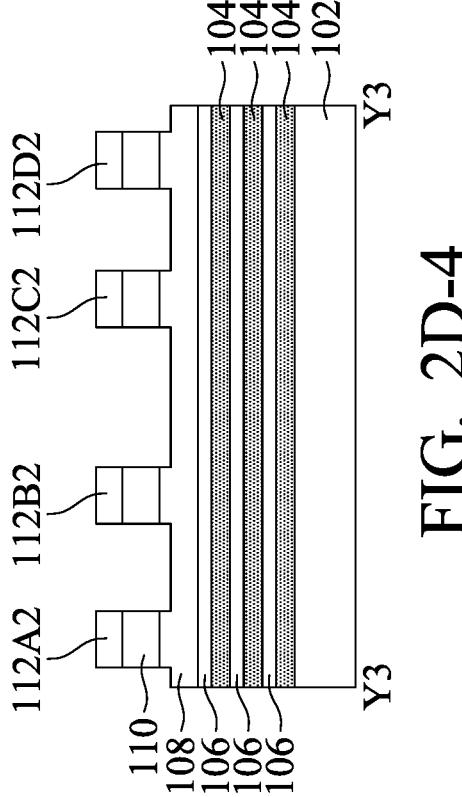

FIGS. 2D through 2D-5 illustrate a semiconductor structure 100 after an etching process, in accordance with some embodiments.

An etching process is performed on the semiconductor structure 100 using the first photoresist patterns 118A, 118B 118C and 118D, as shown in FIGS. 2D through 2D-5, in accordance with some embodiments. The portions of the first strip patterns 112 uncovered by the first photoresist patterns 118A, 118B 118C and 118D are etched away, in accordance with some embodiments. Because the second strip patterns 114 and the first strip patterns 112 have a great difference in etching selectivity, the second strip patterns 114 remains unetched or only slightly recessed, in accordance with some embodiments. The etching process may be an anisotropic etching process such as dry plasma etching.

The etching process also etches the second mask layer 110, and is performed until the first mask layer 108 is exposed, in accordance with some embodiments. The first photoresist patterns 118A-118D and the fourth mask layer 116 may be removed in the etching process, or alternatively removed by an additional removal process, e.g., etching or ashing process.

After the etching process, the portions of the first strip patterns $112_1$ overlapping with the middle portions M1 of the first photoresist patterns 118A, 118B, 118C and 118D are left remained and form island patterns 112A1, 112B1, 112C1 and 112D1, as shown in FIGS. 2D and 2D-2, in accordance with some embodiments. After the etching process, the portions of the first strip patterns $112_2$ overlapping with the middle portions M2 of the first photoresist patterns 118A, 118B, 118C and 118D are left remained and form island patterns 112A2, 112B2, 112C2 and 112D2, as shown in FIGS. 2D and 2D-4, in accordance with some embodiments.

In some embodiments, in the Y direction, the island pattern 112A1 is wider than the island pattern 112A2, the island pattern 112B1 is wider than the island pattern 112B2, the island pattern 112C1 is narrower than the island pattern 112C2, and the island pattern 112D1 is narrower than the island pattern 112D2.

Figure 2E:
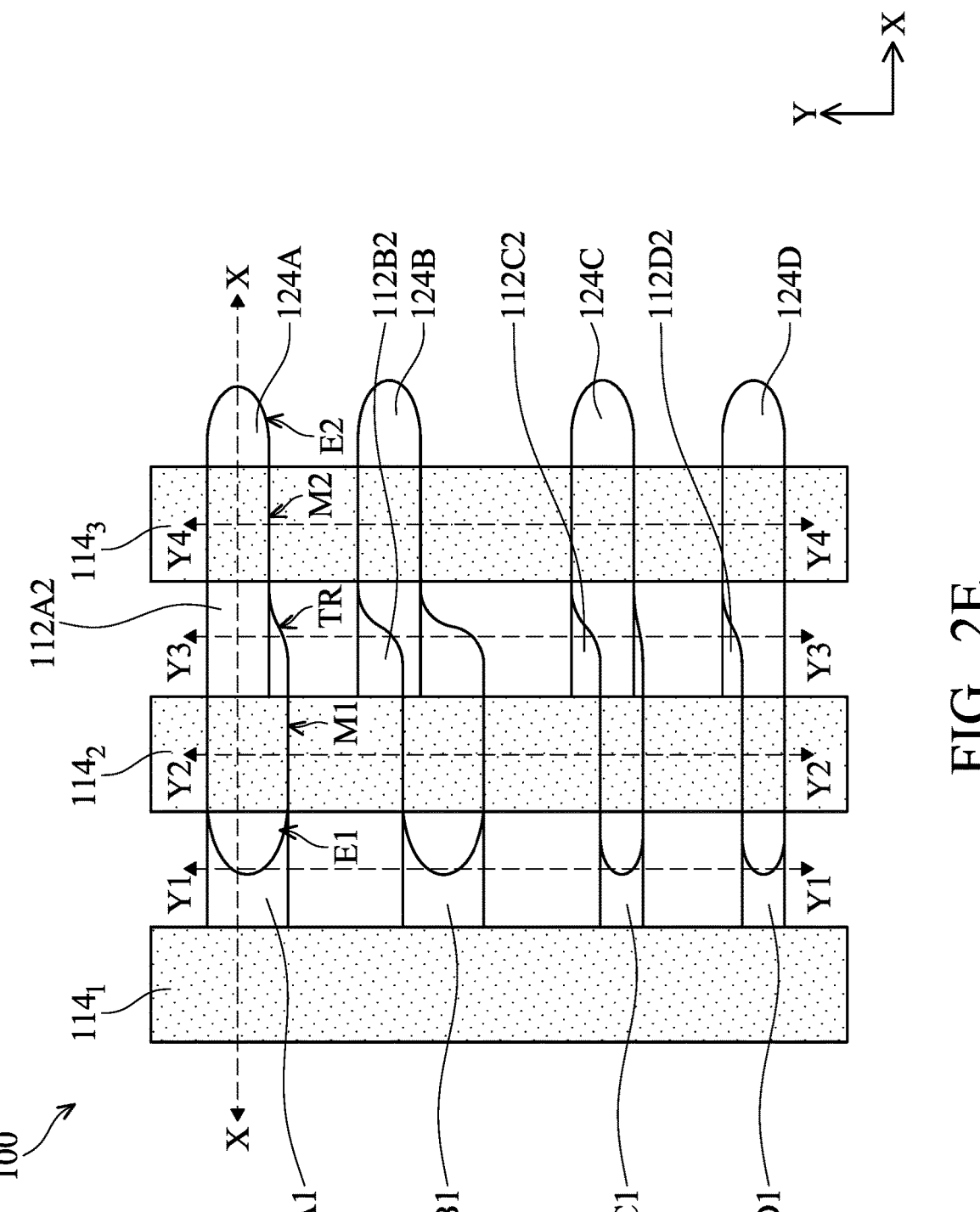
Figures 1, 2, 2E, 3:
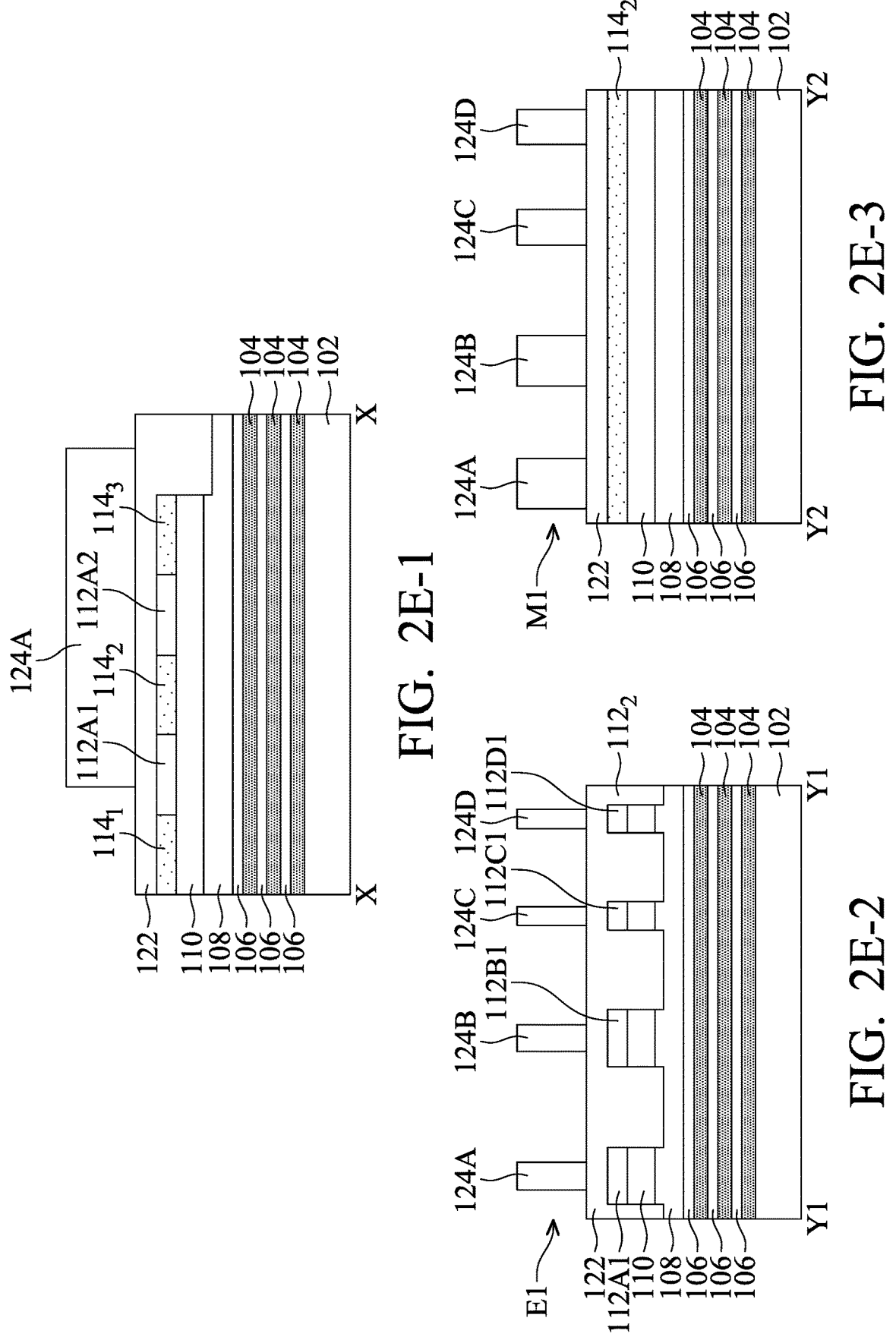
Figures 2, 2E, 3, 4, 5:
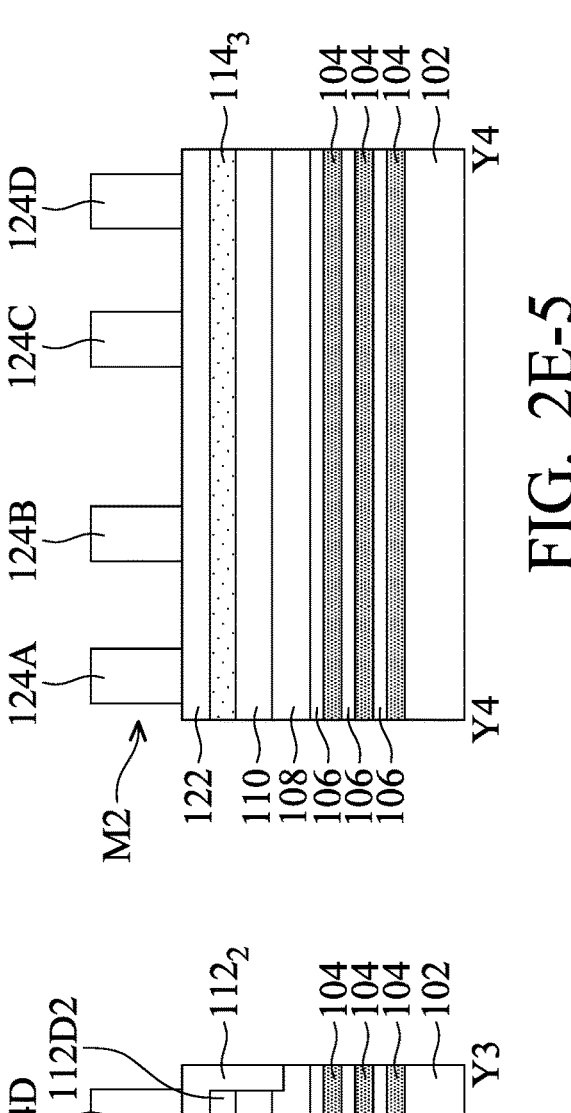

FIGS. 2E through 2E-5 illustrate a semiconductor structure 100 after the formation of a fifth mask layer 122 and second photoresist patterns 124, in accordance with some embodiments.

A fifth mask layer 122 is formed over the first mask layer 108, the island patterns 112A1-A2, 112B1-B2, 112C1-C2 and 112D1-D2 and the second strip patterns 114, as shown in FIG. 2E-1 through 2E-5, in accordance with some embodiments. In some embodiments, the fifth mask layer 122 is made of bottom anti-reflective coating (BARC) material such as an inorganic material (e.g., SiON, SiOC, carbon, and/or another suitable material) or an organic material (e.g., polymer, oligomer, or monomer).

Second photoresist patterns 124 (including 124A, 124B, 124C and 124D) are formed over the fourth mask layer 122, as shown in FIGS. 2E through 2E-5, in accordance with some embodiments. The second photoresist patterns 124A, 124B, 124C and 124D extend in the X direction and are arranged in the Y direction, in accordance with some embodiments. The second photoresist patterns 124A, 124B, 124C and 124D have longitudinal axes parallel to the X direction, in accordance with some embodiments. That is, the dimensions (lengths) of the second photoresist patterns 124A, 124B, 124C and 124D in the X direction are greater than the dimensions (widths) of the second photoresist patterns 124A, 124B, 124C and 124D in the Y direction.

The second photoresist patterns 124A, 124B, 124C and 124D are formed by a photolithography process which may be similar to the photolithography process described above, in accordance with some embodiments. The second photoresist patterns 124A, 124B, 124C and 124D may be patterned with the same mask (or a reticle) for forming the first photoresist patterns 118A, 118B 118C and 118D, in accordance with some embodiments. The second photoresist patterns 124A, 124B, 124C and 124D may have substantially the same profiles as the first photoresist patterns 118A, 118B 118C and 118D, in accordance with some embodiments. The locations of the second photoresist patterns 124A, 124B, 124C and 124D are offset from the locations of the first photoresist patterns 118A, 118B 118C and 118D in the X direction by a distance that is substantially the same as the width of the first strip patterns 112 (or the second strip patterns 114), in accordance with some embodiments.

Each of the second photoresist patterns 124A, 124B, 124C and 124D includes a first edge portion E1, a first middle portion M1, a transition portion TR, a second middle portion M2, and a second edge portion E2, as shown in FIGS. 2E through 2E-5, in accordance with some embodiments. The first edge portion E1 overlaps the island patterns 112A1, 112B1, 112C1 and 112D1 (where the first strip patterns $112_1$ is originally formed), the first middle portion M1 overlaps the second strip pattern $114_1$, the transition portion TR overlaps the island patterns 112A2, 112B2, 112C2 and 112D2 (where the first strip patterns $112_2$ is originally formed), the second middle portion M2 overlaps the second strip pattern $114_3$, and the second edge portion E2 is located at the position where the first strip pattern $112_3$ are originally formed, in accordance with some embodiments.

The width (the dimension in the Y direction) of the first middle portion M1 of the second photoresist patterns 124A, 124B, 124C and 124D is different than the width (the dimension in the Y direction) of the second middle portion M2 of the second photoresist patterns 124A, 124B, 124C and 124D, as shown in FIG. 2E. in accordance with some embodiments.

For example, the first middle portion M1 of the second photoresist pattern 124A is wider than the second middle portion M2 of the second photoresist pattern 124A. The first middle portion M1 of the second photoresist pattern 124B is wider than the second middle portion M2 of the second photoresist pattern 124B.

For example, the first middle portion M1 of the second photoresist pattern 124C is narrower than the second middle portion M2 of the second photoresist pattern 124C. The first middle portion M1 of the second photoresist pattern 124D is narrower than the second middle portion M2 of the second photoresist pattern 124D.

The opposites sidewalls of the first middle portion M1 may be not aligned with the opposite sidewalls of the second middle portion M2, e.g., the first middle portion M1 and the second middle portion M2 of the second photoresist pattern 124B and 124C, as shown in FIG. 2E, in accordance with some embodiments.

One of the opposite sidewalls of the first middle portion M1 is aligned with one of the opposite sidewalls of the second middle portion M2, while another sidewall of first middle portion M1 is not aligned with another sidewall of the second middle portion M2, e.g., the first middle portion M1 and the second middle portion M2 of the second photoresist patterns 124A and 124D, as shown in FIG. 2E, in accordance with some embodiments.

The transition portion TR is located between and connected to the first middle portion M1 and the second middle portion M2, as shown in FIG. 2E, in accordance with some embodiments. The transition portion TR is used to transition the width difference between the first middle portion M1 and the second middle portion M2, in accordance with some embodiments. Because of the characteristics of the photolithography process, the transition portion TR may have curved sidewall(s) (e.g., smiling profile) at the locations where the sidewall of the first middle portion M1 is not aligned with the sidewall of the second middle portion M2.

Figure 2F:
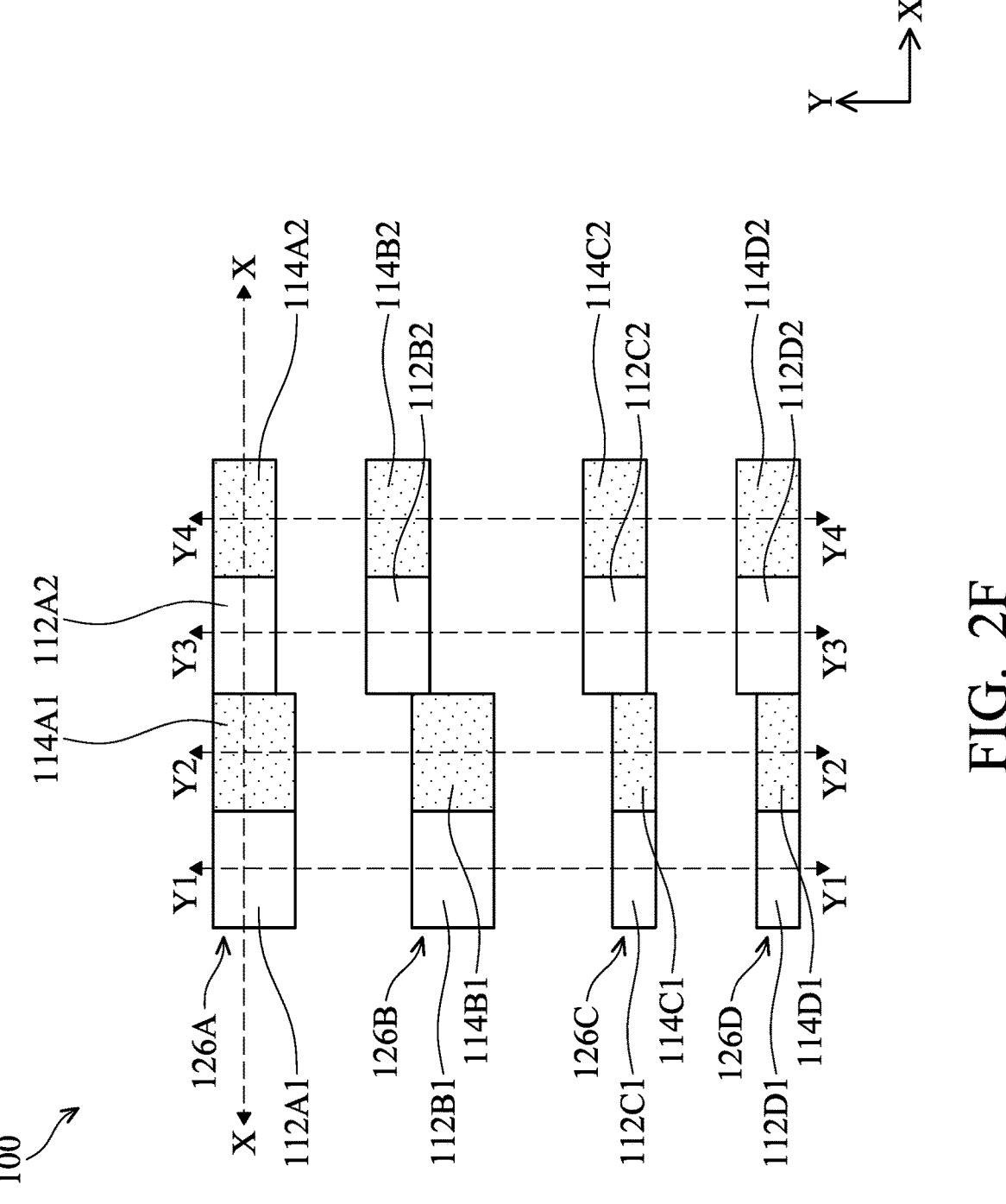
Figures 1, 2F:
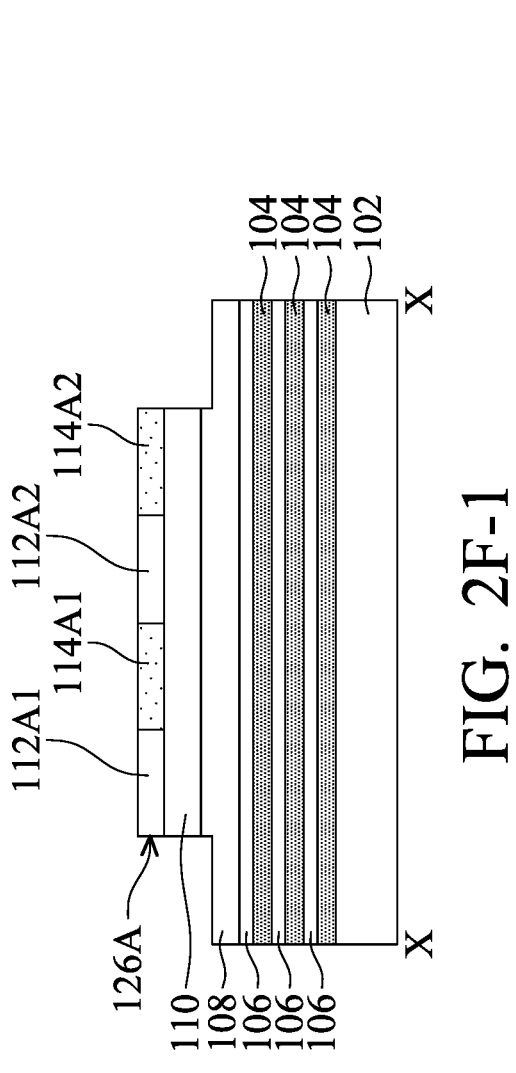
Figures 2, 2F, 3:
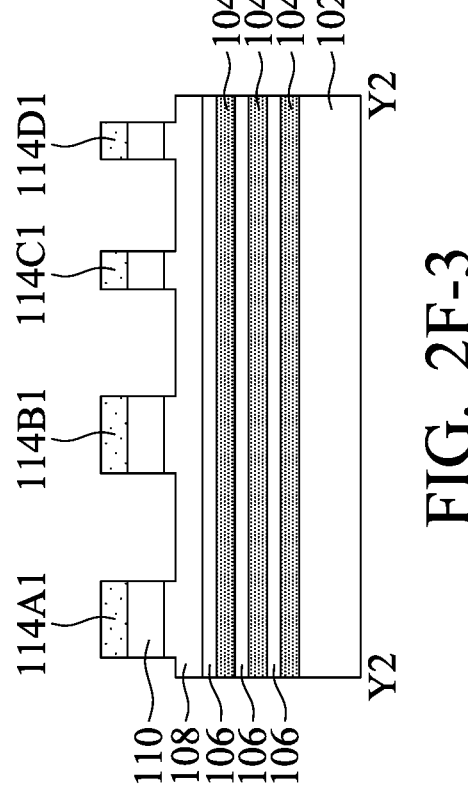
Figures 2, 2F:
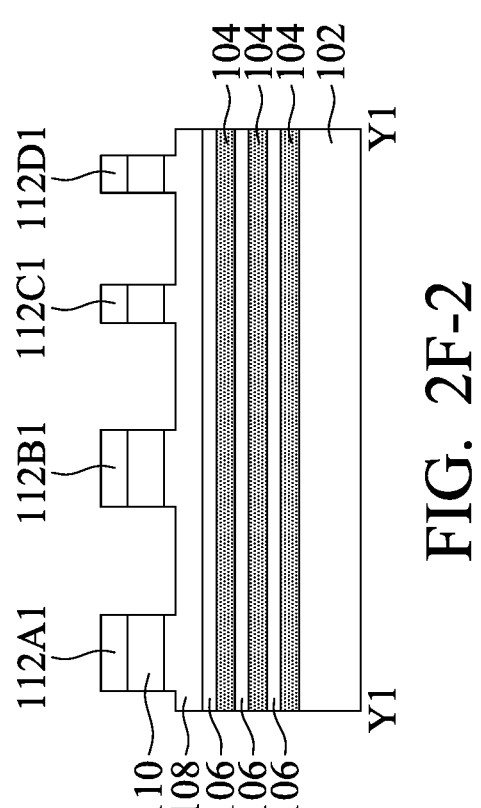
Figures 2, 2F, 3, 4, 5:
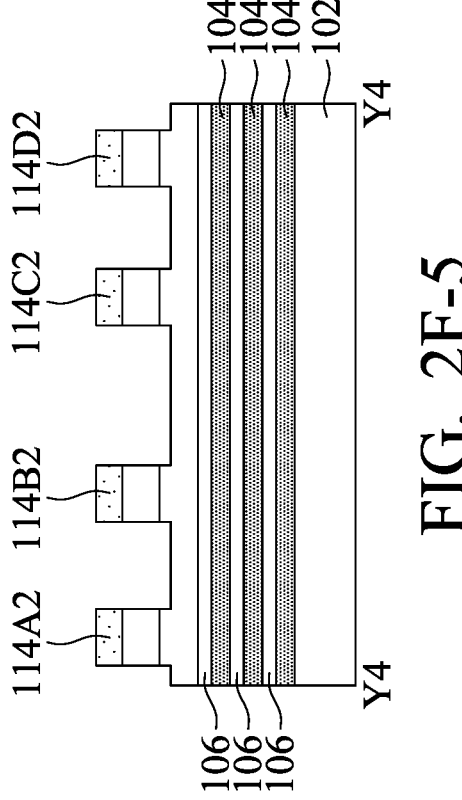
Figures 2, 2F, 3, 4:
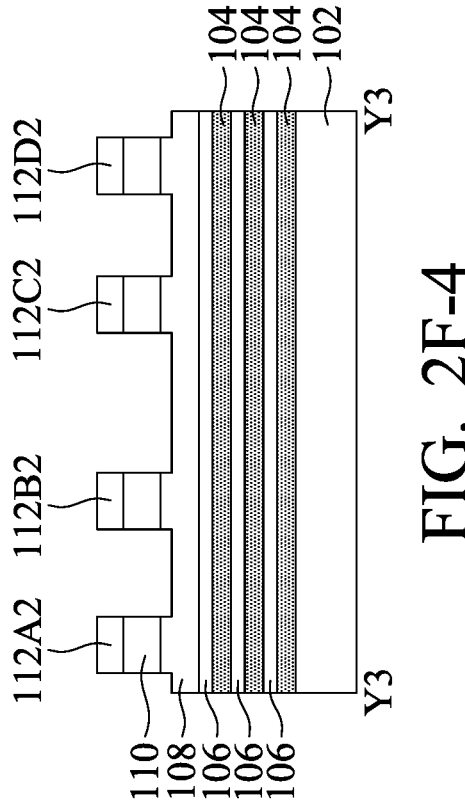

FIGS. 2F through 2F-5 illustrate a semiconductor structure 100 after an etching process, in accordance with some embodiments.

An etching process is performed on the semiconductor structure 100 using the second photoresist patterns 124A, 124B 124C and 124D, as shown in FIGS. 2F through 2F-5, in accordance with some embodiments. The portions of the second strip patterns 114 uncovered by the second photoresist patterns 124A, 124B 124C and 124D are etched away, in accordance with some embodiments. Because the island patterns 112A1-112D2 (formed from the first strip patterns 112) and the second strip patterns 114 have a great difference in etching selectivity, the island patterns 112A1-112D2 remains unetched or only slightly recessed, in accordance with some embodiments. The etching process may be an anisotropic etching process such as dry plasma etching.

The etching process also etches the second mask layer 110, and is performed until the first mask layer 108 is exposed, in accordance with some embodiments. The second photoresist patterns 124A-124D and the fifth mask layer 122 may be removed in the etching process, or alternatively removed by an additional removal process, e.g., etching or ashing process.

After the etching process, the portions of the second strip patterns $114_2$ overlapping with the middle portions M1 of the second photoresist patterns 124A, 124B, 124C and 124D are left remained and form island patterns 114A1, 114B1, 114C1 and 114D1, as shown in FIGS. 2F and 2F-3, in accordance with some embodiments. After the etching process, the portions of the second strip patterns $114_3$ overlapping with the middle portions M2 of the second photoresist patterns 124A, 124B, 124C and 124D are left remained and form island patterns 114A2, 114B2, 114C2 and 114D2, as shown in FIGS. 2F and 2F-5, in accordance with some embodiments.

In some embodiments, in the Y direction, the island pattern 114A1 is wider than the island pattern 114A2, the island pattern 114B1 is wider than the island pattern 114B2, the island pattern 114C1 is narrower than the island pattern 114C2, and the island pattern 114D1 is narrower than island pattern 114D2.

The island patterns 112A1, 114A1, 112A2 and 114A2 are consecutively and immediately arranged in the X direction, in accordance with some embodiments. The island patterns 112A1 and 114A1 have the same width, and the island patterns 112A2 and 114A2 have the same width, in accordance with some embodiments. The sidewalls of the island patterns 112A1 and 114A1 with respect to the Y direction (extending in the X direction) are aligned with each other, and the sidewalls of the island patterns 112A2 and 114A2 with respect to the Y direction (extending in the X direction) are aligned with each other, in accordance with some embodiments.

The island patterns 112B1, 114B1, 112B2 and 114B2 are consecutively and immediately arranged in the X direction, in accordance with some embodiments. The island patterns 112B1 and 114B1 have the same width, and the island patterns 112B2 and 114B2 have the same width, in accordance with some embodiments. The sidewalls of the island patterns 112B1 and 114B1 with respect to the Y direction (extending in the X direction) are aligned with each other, and the sidewalls of the island patterns 112B2 and 114B2 with respect to the Y direction (extending in the X direction) are aligned with each other, in accordance with some embodiments.

The island patterns 112C1, 114C1, 112C2 and 114C2 are consecutively and immediately arranged in the X direction, in accordance with some embodiments. The island patterns 112C1 and 114C1 have the same width, and the island patterns 112C2 and 114C2 have the same width, in accordance with some embodiments. The sidewalls of the island patterns 112C1 and 114C1 with respect to the Y direction (extending in the X direction) are aligned with each other, and the sidewalls of the island patterns 112C2 and 114C2 with respect to the Y direction (extending in the X direction) are aligned with each other, in accordance with some embodiments.

The island patterns 112D1, 114D1, 112D2 and 114D2 are consecutively and immediately arranged in the X direction, in accordance with some embodiments. The island patterns 112D1 and 114D1 have the same width, and the island patterns 112D2 and 114D2 have the same width, in accordance with some embodiments. The sidewalls of the island patterns 112D1 and 114D1 with respect to the Y direction (extending in the X direction) are aligned with each other, and the sidewalls of the island patterns 112D2 and 114D2 with respect to the Y direction (extending in the X direction) are aligned with each other, in accordance with some embodiments.

The island patterns 112A1-112D2 and the island patterns 114A1-114D2 are collectively referred to as hard mask patterns 126A, 126B, 126C and 126D, which are used for forming active regions, in accordance with some embodiments.

Figure 2G:
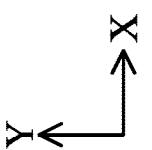
Figure 2G:
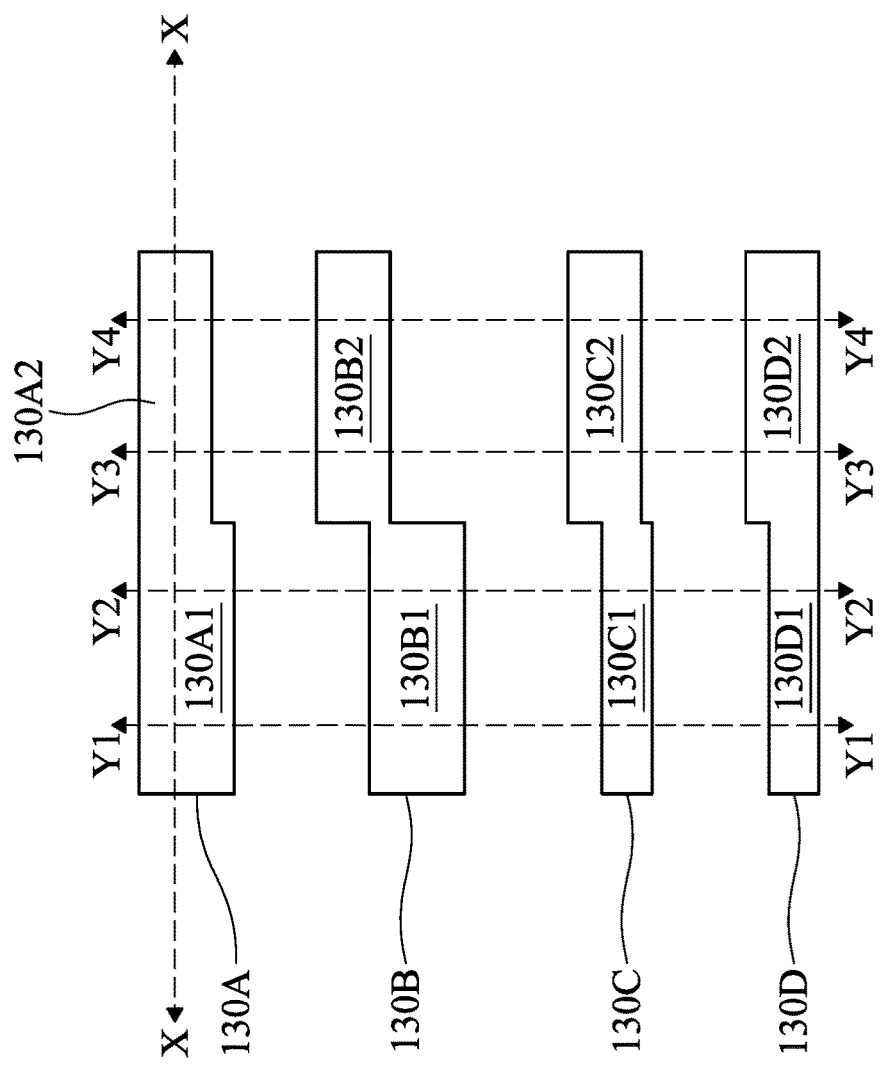
Figures 1, 2, 2G, 3:
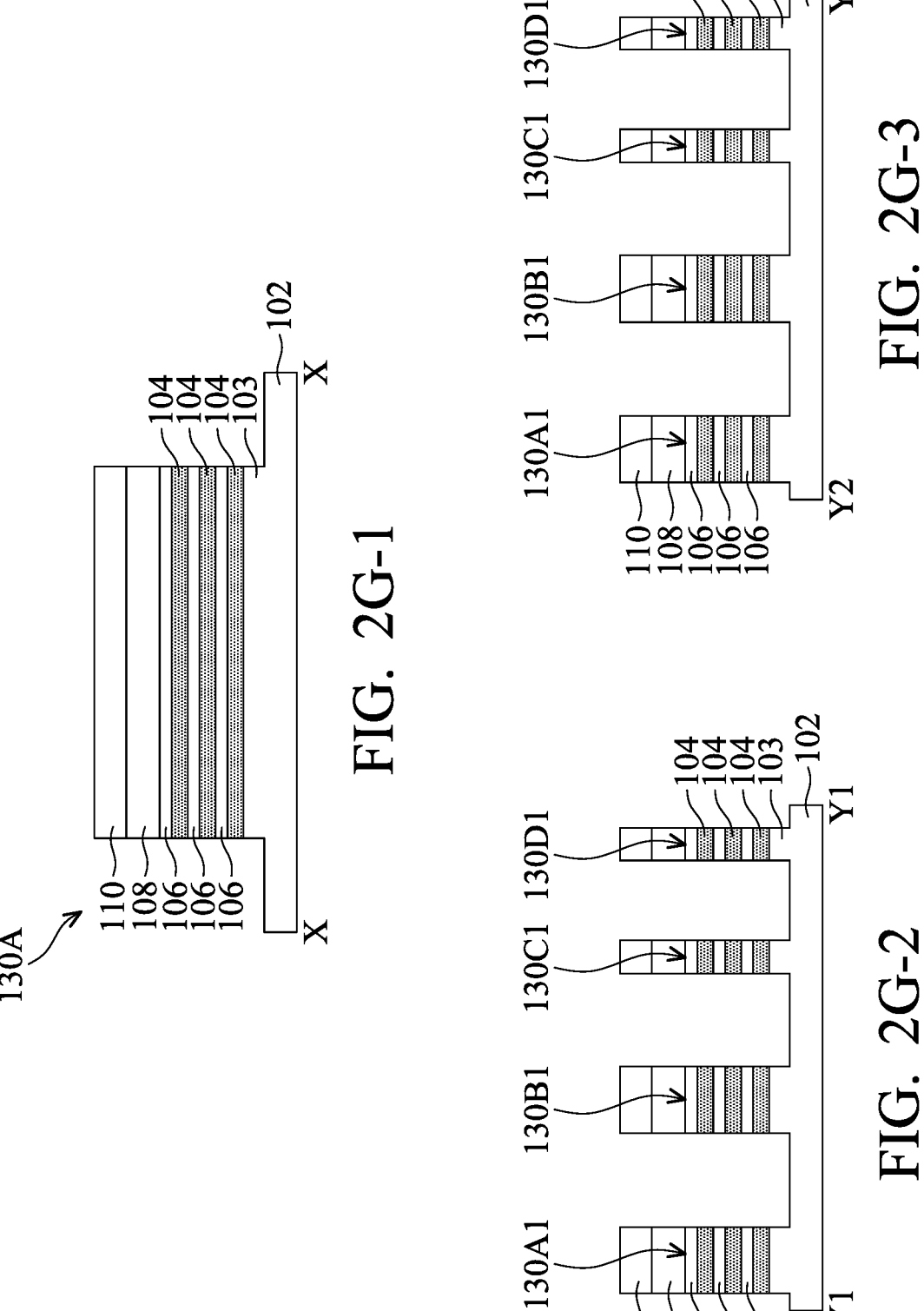
Figures 2, 2G, 3, 4, 5:
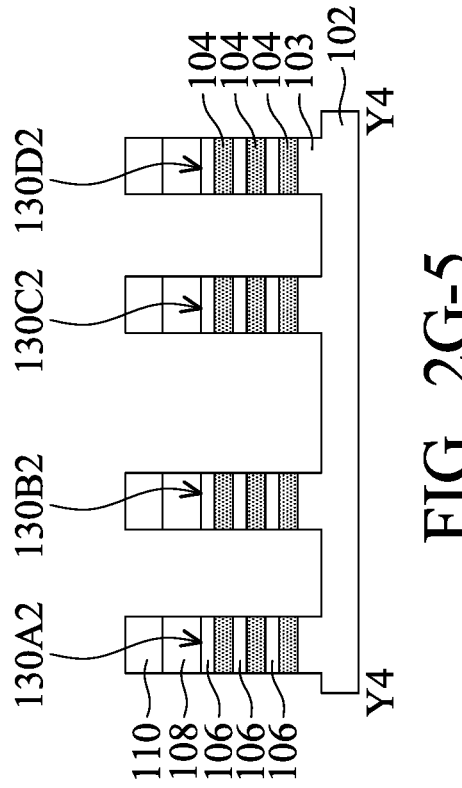
Figures 2, 2G, 3, 4:
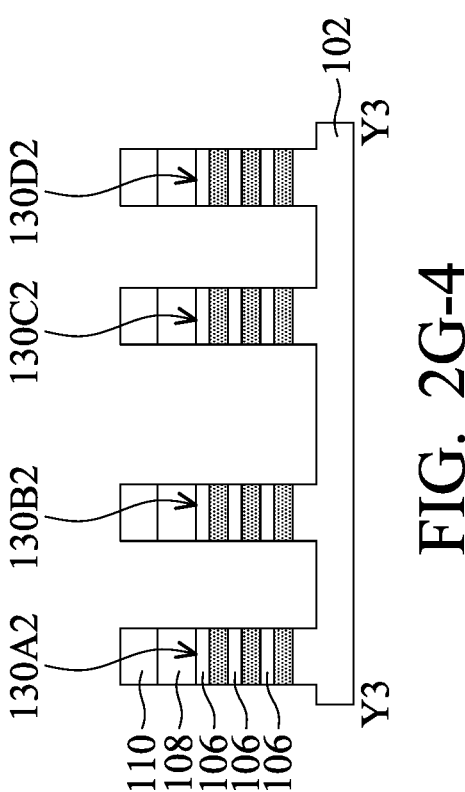
Figures 2, 2G, 3, 4, 5, 6:
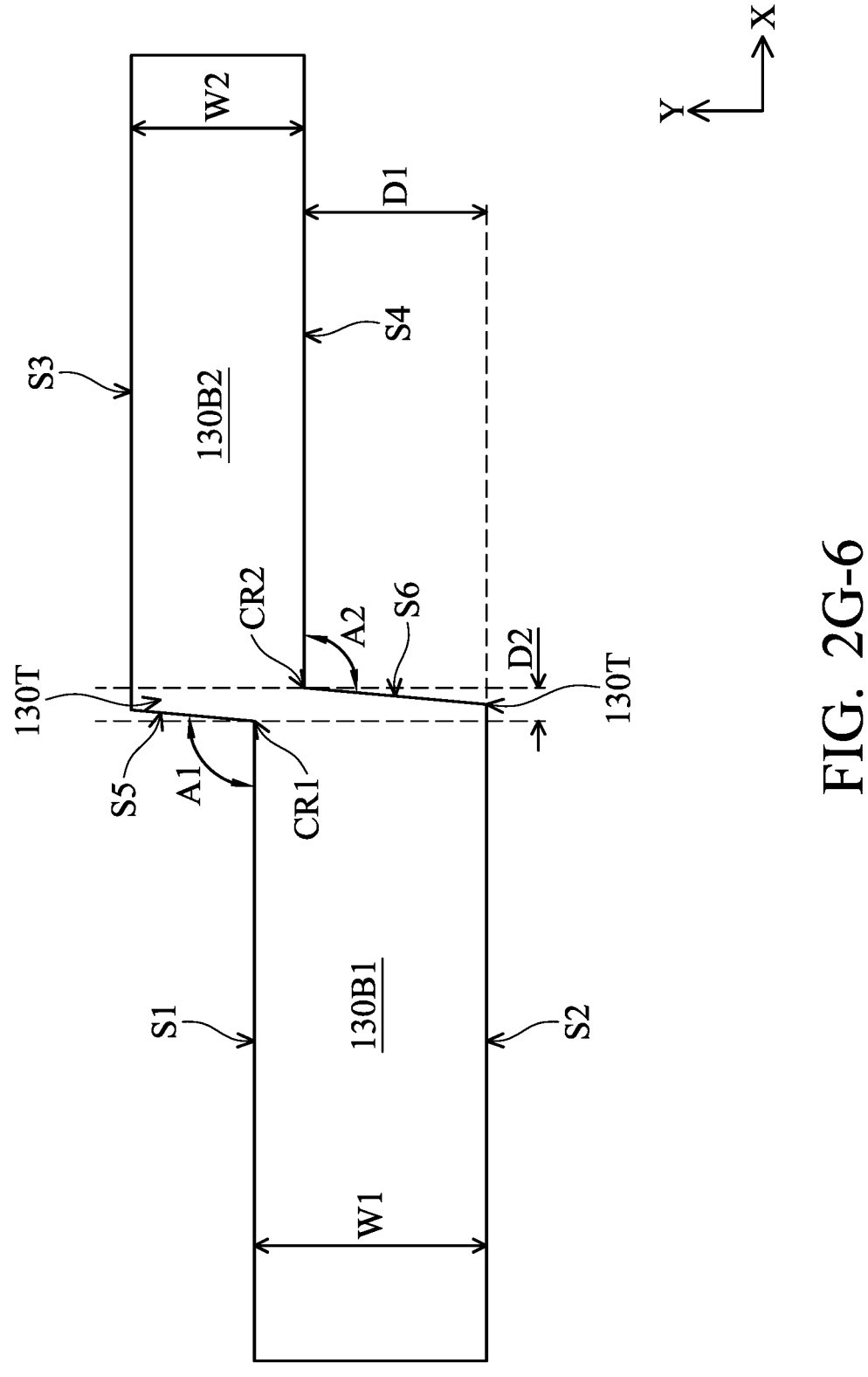

FIGS. 2G through 2G-5 illustrate a semiconductor structure 100 after the formation of active regions 130, in accordance with some embodiments.

An etching process is performed on the semiconductor structure 100 using the hard mask patterns 126A, 126B, 126C and 126D, in accordance with some embodiments. The portions of the epitaxial stack (including the semiconductor layers 104 and 106) and the underlying substrate 102 uncovered by the hard mask patterns 126A, 126B, 126C and 126D are etched away, thereby forming trenches and the active regions 130A, 130B and 130C and 130D protruding from between trenches, as shown in FIGS. 2G through 2G-5, in accordance with some embodiments. The etching process may be an anisotropic etching process such as dry plasma etching. The hard mask patterns 126A, 126B, 126C and 126D may be removed in the etching process, or alternatively removed by an additional removal process, e.g., etching or ashing process.

The portion of substrate 102 protruding from between the trenches serves as lower fin elements 103 of the active regions 130A, 130B, 130C and 130D, in accordance with some embodiments. A remainder of the epitaxial serves as the upper fin elements of the active regions 130A,130B, 130C and 130D, in accordance with some embodiments. In some embodiments, the active regions 130A-130D are the fin structure 130 as shown in FIG. 1.

The first semiconductor layers 104 are configured as sacrificial layers and will be removed to form gaps to accommodate gate materials, and the second semiconductor layers 106 will form nanostructures (e.g., nanowires or nanosheets) that laterally extend between source/drain features and serve as channel for the resulting semiconductor devices (such as nanostructure transistors), in accordance with some embodiments.

In some embodiments, the active regions 130A-130D extend in the X direction. The active regions 130A-130D have longitudinal axes parallel to the X direction, in accordance with some embodiments. That is, the dimensions (lengths) of the active regions 130A-130D in the X direction are greater than the dimensions (widths) of the active regions 130A-130D in the Y direction.

Each of the active regions 130 includes two segments with different widths, in accordance with some embodiments. In some embodiments, the active region 130A includes a wider fin segment 130A1 (transferred from the island patterns 112A1 and 114A1) and a narrower fin segment 130A2 (transferred from the island patterns 112A2 and 114A2). In some embodiments, the active region 130B includes a wider fin segment 130B1 (transferred from the island patterns 112B1 and 114B1) and a narrower fin segment 130B2 (transferred from the island patterns 112B2 and 114B2). In some embodiments, the active region 130C includes a narrower fin segment 130C1 (transferred from the island patterns 112C1 and 114C1) and a wider fin segment 130C2 (transferred from the island patterns 112C2 and 114C2). In some embodiments, the active region 130D includes a narrower fin segment 130D1 (transferred from the island patterns 112D1 and 114D1) and a wider fin segment 130D2 (transferred from the island patterns 112D2 and 114D2).

In some embodiments, devices formed over the wider fin segments (e.g., 130A1, 130B1, 130C2 and 130D2) require high on-state current, while the devices formed over the narrower fin segments (e.g., 130A2, 130B2, 130C1 and 130D1) require low on-state current. Therefore, a continuous active region 130 including segments with different widths can simultaneously meet the performance requirements of the different devices.

In accordance with the embodiments of the present disclosure, the hard mask patterns 126A-126D are formed by patterning the strip patterns 112 and 114 with a great difference in etching selectivity using two photolithography processes, and thus the transition portions TR of the first photoresist patterns 118 and the second photoresist patterns 124 are not transferred into the hard mask patterns 126A-126D. Therefore, the narrower fin segment and the wider fin segment (e.g., 130A1 and 130A2) are continuous strips and are tightly connected to each other, which may improve the circuit density of the resulting semiconductor device. Furthermore, the power consumption of the resulting semiconductor devices may be reduced, and the performance of the resulting semiconductor devices may be enhanced.

FIG. 2G-6 is an enlarged view of FIG. 2G to illustrate more detail of the active region 130B, in accordance with some embodiments of the disclosure.

The fin segment 130B1 of the active region 130B has a width W1, and the fin segment 130B2 of the active region 130B has a width W2 that is narrower than the width W1, in accordance with some embodiments. In some embodiments, the width W1 is in a range from about 10 nm to about 150 nm. In some embodiments, the width W2 is in a range from about 5 nm to about 145 nm.

The fin segment 130B1 has sidewalls S1 and S2 (or edge) with respect to the Y direction (extending in the X direction), in accordance with some embodiments. The fin segment 130B2 has sidewalls (or edge) S3 and S4 with respect to the Y direction (extending in the X direction), in accordance with some embodiments.

The sidewall S4 of the fin segment 130B2 is offset from the sidewall S2 of the fin segment 130B1 in the Y direction by a distance D1, in accordance with some embodiments. In some embodiments, the distance D1 is less than the width W1 and is in a range from 1 nm about to about 10 nm. The sidewall S3 of the fin segment 130B2 is offset from the sidewall S1 of the fin segment 130B1 in the Y direction by a distance that is less than D1, in accordance with some embodiments.

The active region 130B further includes a transition segment 130T, in accordance with some embodiments. The transition portion TR transitions the width difference between the fin segment 130B1 and the fin segment 130B2, in accordance with some embodiments. The transition segment 130T1 has sidewalls (or edge) S5 and S6 extending in or approximately in the Y direction, in accordance with some embodiments. The sidewall S1 is connected to the sidewall S3 through the sidewall S5, in accordance with some embodiments. In some embodiments, a corner CR1 between the sidewall S5 and the sidewall S1 has an angle A1 that is a right angle (i.e., 90 degrees) or an approximately right angle of from about 90 degrees to about 95 degrees. The sidewall S2 is connected to the sidewall S4 through the sidewall S6, in accordance with some embodiments. In some embodiments, a corner CR2 between the sidewall S6 and the sidewall S2 has an angle A2 that is a right angle (i.e., 90 degrees) or an approximately right angle of from about 90 degrees to about 95 degrees. In some embodiments, the transition segment 130T has a dimension D2 in the X direction. In some embodiments, the dimension D2 is less than about 5 nm, e.g., in a range from about 1 nm to about to about 4.5 nm.

Figure 2H:
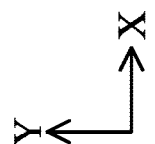
Figures 1, 2H:
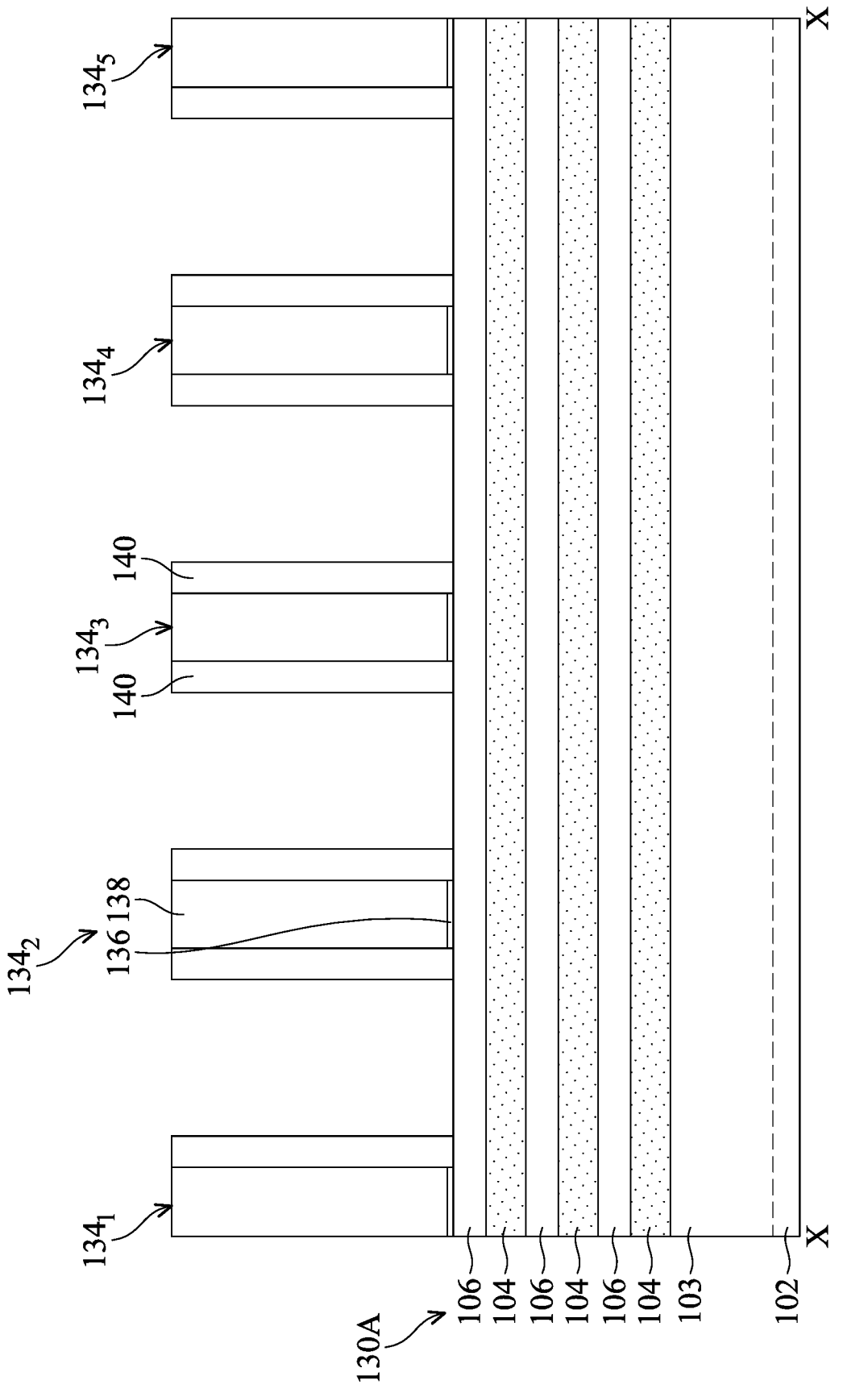
Figures 2, 2H, 3, 4:
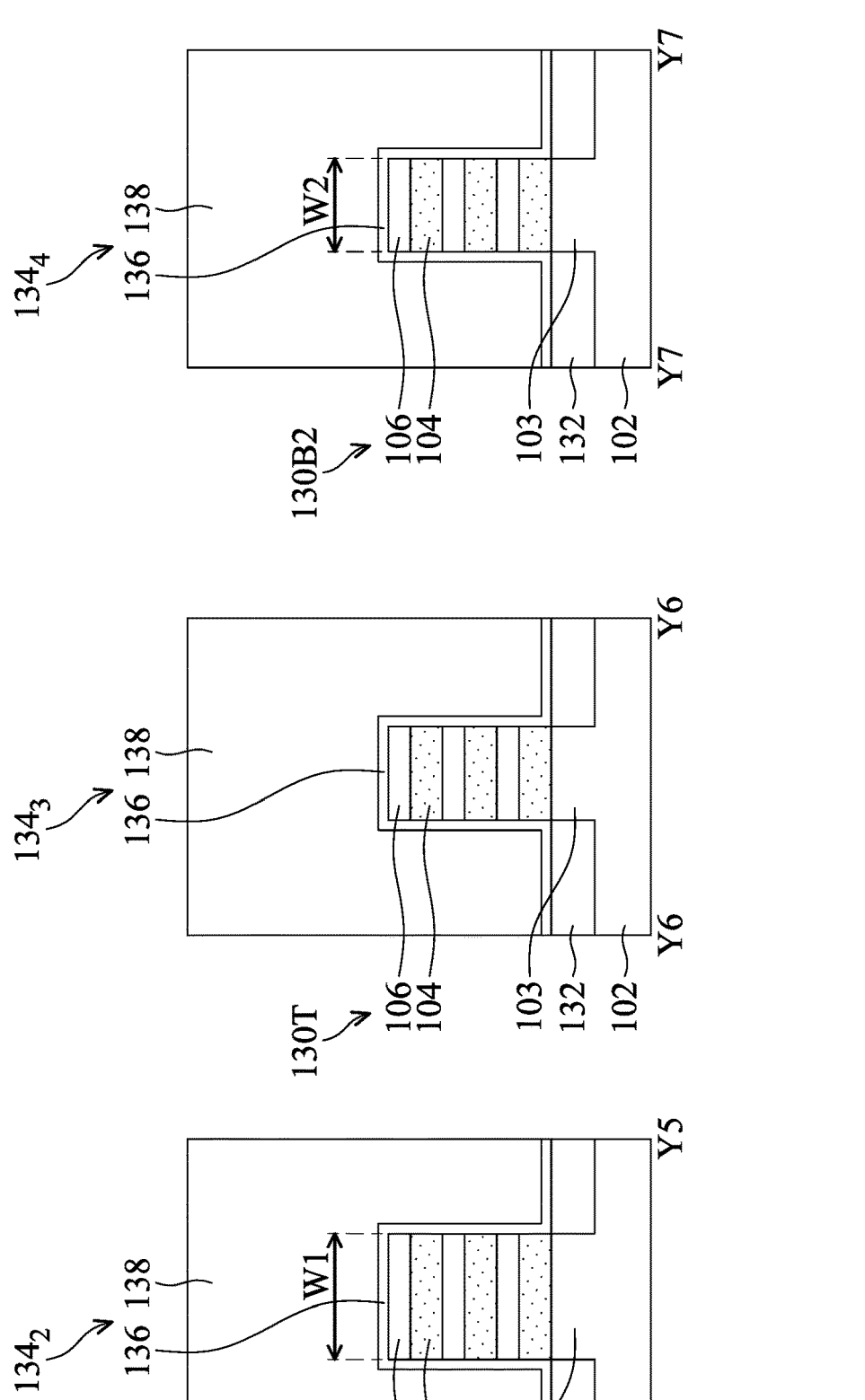

FIGS. 2H through 2H-4 illustrate a semiconductor structure 100 after the formation of an isolation structure 132, dummy gate structures 134 and gate spacer layers 140. FIG. 2H is a plan view of the semiconductor structure 100. FIGS. 2H-1, 2H-2, 2H-3 and 2H-4 are cross-sectional views corresponding to line X-X, line Y5-Y5, line Y6-Y6 and line Y7-Y7 of FIG. 2H.

An isolation structure 132 is formed to surround the lower fin elements 103 of the active regions 130A-130D, as shown in FIGS. 2H-2, 2H-3 and 2H-4, in accordance with some embodiments. The bottom surface of the isolation structure 132 is illustrated as a dashed line in FIG. 2H-1. The isolation structure 132 is configured to electrically isolate active regions the active regions 130A-130D of the semiconductor structure 100 and is also referred to as shallow trench isolation (STI) feature, in accordance with some embodiments.

The formation of the isolation structure 132 includes forming an insulating material to overfill the trenches, in accordance with some embodiments. In some embodiments, the insulating material is made of silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, the insulating material is deposited using CVD (such as flowable CVD (FCVD), low-pressure CVD (LPCVD), plasma-enhanced CVD (PECVD), high density plasma CVD (HDP-CVD), or high aspect ratio process (HARP)), atomic layer deposition (ALD), another suitable technique, or a combination thereof.

A planarization process is performed on the insulating material to remove a portion of the insulating material above the active regions 130A-130D, in accordance with some embodiments. The planarization may be chemical mechanical polishing (CMP), etching back process, or a combination thereof. The insulating material is then recessed by an etching process (such as dry plasma etching and/or wet chemical etching) until the sidewalls of the upper fin elements of the active regions 130A-130D are exposed, in accordance with some embodiments. The recessed insulating material serves as the isolation structure 132, in accordance with some embodiments.

Dummy gate structures (including $134_1$, $134_2$, $134_3$, $134_4$ and $134_5$) are formed across the active regions 130A-130D, as shown in FIGS. 2H-1 through 2H-4, in accordance with some embodiments. The dummy gate structures 134 are configured as sacrificial structures, in accordance with some embodiments. In some embodiments, the dummy gate structures 134 extend in the Y direction. The dummy gate structures 134 have longitudinal axes parallel to the Y direction, in accordance with some embodiments. That is, the dimensions (lengths) of the dummy gate structures 134 in the Y direction are greater than the dimensions (widths) of the dummy gate structures 134 in the X direction. The dummy gate structures 134 may be the gate structures 134 shown in FIG. 1.

The dummy gate structures $134_1$, $134_2$, $134_4$ and $134_5$ surround the channel regions of the active regions 130A-130D, in accordance with some embodiments. The dummy gate structure 134 entirely covers the transition segments (e.g., 130T) of the active regions 130A-130D, in accordance with some embodiments. The dummy gate structures $134_1$, $134_2$, $134_4$ and $134_5$ will be replaced with final gate stacks, and the dummy gate structures $134_3$ will be replaced with a dielectric cutting structure which electrically isolates one fin segment (e.g., 130B1) from another fin segment (e.g., 130B2) of an active region, in accordance with some embodiments.

In some embodiments, the dimension D2 (FIG. 2G-6) of the transition segments (e.g., 130T) is less than the pitch P1 of the dummy gate structure 134. In some embodiments, the ratio of the dimension D2 (FIG. 2G-6) to the pitch P1 is in a range from about 0.1 to about 0.9. In the case where the transition portions of the photoresist patterns are transferred into the active regions, the transition segments of the active regions may have a dimension that is greater than one or more pitches of the dummy gate structures. In accordance with the embodiments of the present disclosure, the active regions 130A-130D are formed to have smaller transition segments, thereby further improving the circuit density.

Each of the dummy gate structures 134 includes a dummy gate dielectric layer 136 and a dummy gate electrode layer 138 formed over the dummy gate dielectric layer 136, as shown in FIGS. 2H-1 through and 2H-4, in accordance with some embodiments. In some embodiments, the dummy gate dielectric layer 136 is conformally formed along the upper fin elements of the active regions 130A-130D. In some embodiments, the dummy gate dielectric layer 136 is made of one or more dielectric materials, such as silicon oxide (SiO), silicon nitride (SiN), silicon oxynitride (SiON), $HfO_2$, HfZrO, HfSiO, HfTiO, HfAlO. In some embodiments, the dielectric material is deposited using ALD, CVD, thermal oxidation, physical vapor deposition (PVD), another suitable technique, or a combination thereof.

In some embodiments, the dummy gate electrode layer 138 is made of semiconductor material such as polysilicon or poly-silicon germanium. In some embodiments, the material for the dummy gate electrode layer 138 is deposited using CVD, ALD, another suitable technique, or a combination thereof.

In some embodiments, the formation of the dummy gate structures 134 includes globally and conformally depositing a dielectric material for the dummy gate dielectric layer 136 over the semiconductor structure 100, depositing a material for the dummy gate electrode layer 138 over the dielectric material, planarizing the material for the dummy gate electrode layer 138, and patterning the material for the dummy gate electrode layer 138 and the dielectric material into the dummy gate structures 134.

The patterning process includes forming a patterned hard mask layer (not shown) over the material for the dummy gate electrode layer 138, in accordance with some embodiments. The patterned hard mask layer corresponds to and overlaps the channel region of the active regions 130A-130D and the transition segment of the active regions 130A-130D, in accordance with some embodiments. The materials for dummy gate dielectric layer 136 and the dummy gate electrode layer 138, uncovered by the patterned hard mask layer, are etched away until the source/drain regions of the active regions 130A-130D are exposed, in accordance with some embodiments.

Gate spacer layers 140 are formed along the sidewalls of the dummy gate structures 134, as shown in FIG. 2H-1, in accordance with some embodiments. The gate spacer layers 140 are used to offset the subsequently formed source/drain features and separate the source/drain features from the gate structure, in accordance with some embodiments. In some embodiments, the gate spacer layers 140 are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN).

In some embodiments, the formation of the gate spacer layers 140 includes globally and conformally depositing a dielectric material for the gate spacer layers 140 over the semiconductor structure using atomic layer deposition (ALD), CVD (such as LPCVD, PECVD, HDP-CVD and HARP), another suitable method, and/or a combination thereof., followed by an anisotropic etching process. In some embodiments, the etching process is performed without an additional photolithography process. The portions of the dielectric material that remain on the sidewalls of the dummy gate structures 134 serve as the gate spacer layers 140, in accordance with some embodiments.

Figure 2I:
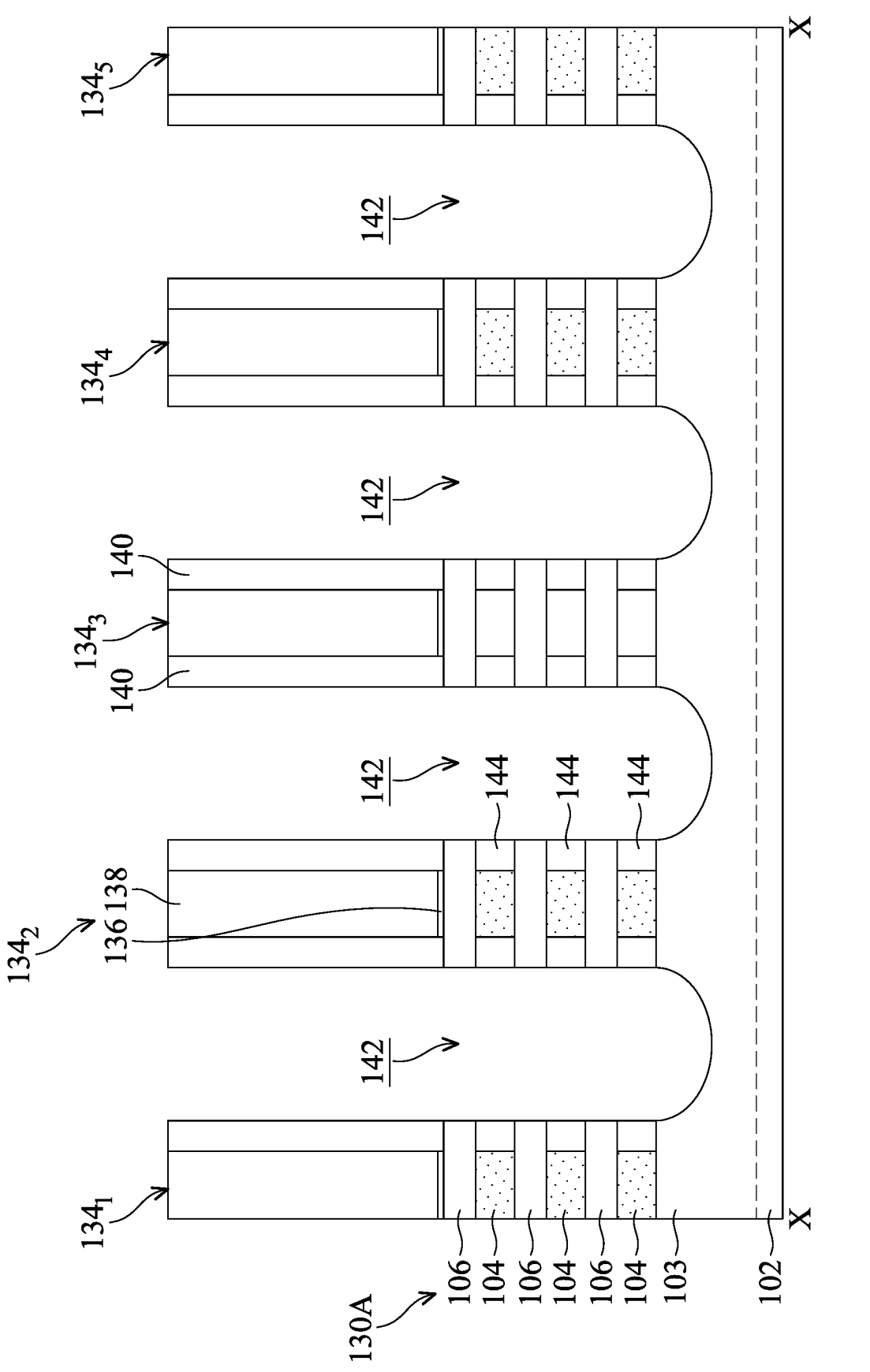
FIG. 2I is a cross-sectional view of the semiconductor structure at an intermediate stage corresponding to line X-X of FIG. 2H, in accordance with some embodiments of the disclosure.

FIG. 2I illustrates a semiconductor structure 100 after the formation of source/drain recess 142 and inner spacer layers 144, in accordance with some embodiments. FIG. 2I is a cross-sectional view corresponding to line X-X of FIG. 2H.

An etching process is performed to recess the source/drain regions of the active regions 130A-130D, thereby forming source/drain recesses 142, as shown in FIG. 2I, in accordance with some embodiments. The source/drain recesses 142 extends into the lower fin elements 103, in accordance with some embodiments.

The etching process may be an anisotropic etching process such as dry plasma etching. The gate spacer layers 140 and the dummy gate structure 134 may serve as etch masks such that the source/drain recesses 142 are formed self-aligned opposite sides of the dummy gate structure 134, in accordance with some embodiments. In some embodiments, the etching process is performed without the need for an additional photolithography process.

Afterward, an etching process is performed to laterally recess, from the source/drain recesses 142, the first semiconductor layers 104 of the active regions 130A-130D, thereby forming notches, and then inner spacer layers 144 are formed in the notches, as shown in FIG. 2I, in accordance with some embodiments. The inner spacer layers 144 are formed to abut the recessed side surfaces of the first semiconductor layers 104, in accordance with some embodiments. In some embodiments, the inner spacer layers 144 are located between adjacent second semiconductor layers 106 and between the lowermost second semiconductor layer 106 and the lower fin element 103. In some embodiments, the inner spacer layers 144 extend directly below the gate spacer layers 140, in accordance with some embodiments.

The inner spacer layers 144 may avoid the source/drain features and the gate stack from being in direct contact and are configured to reduce the parasitic capacitance between the gate stack and the source/drain features (i.e., Cgs and Cgd), in accordance with some embodiments. In some embodiments, the inner spacer layers 144 are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN).

In some embodiments, the inner spacer layers 144 are formed by depositing a dielectric material for the inner spacer layers 144 over the semiconductor structure 100 to overfill the notches, and then etching back the dielectric material to remove the dielectric material outside the notches. Portions of the dielectric material left in the notches serve as the inner spacer layers 144, in accordance with some embodiments. In some embodiments, the deposition process includes ALD, CVD (such as PECVD, LPCVD or HARP), another suitable technique, or a combination thereof. In some embodiments, the etching back process includes an anisotropic etching process such as dry plasma etching, an isotropic etching process such as dry chemical etching, remote plasma etching or wet chemical etching, or a combination thereof.

Figure 2J:
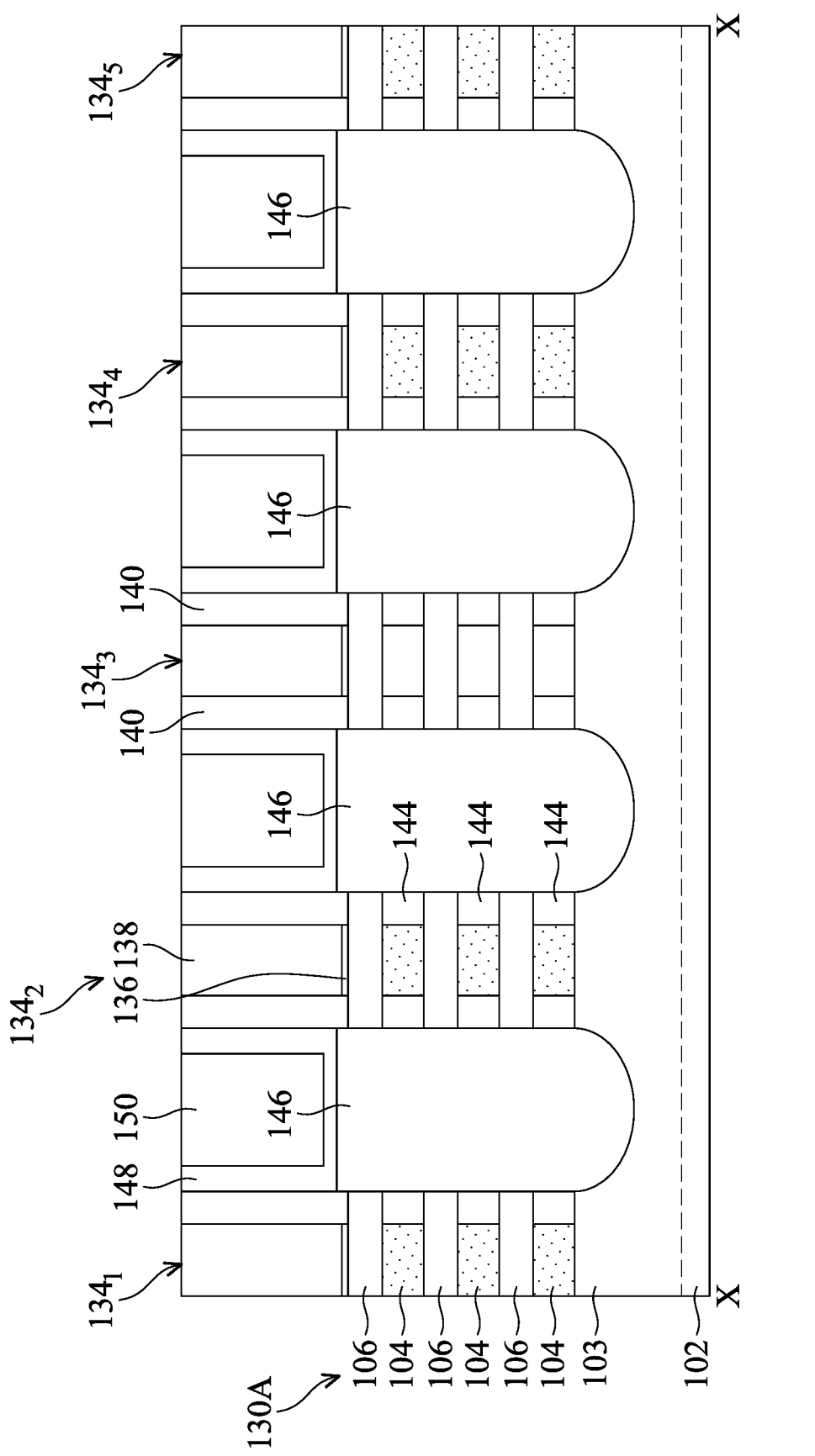
FIG. 2J is a cross-sectional view of the semiconductor structure at an intermediate stage corresponding to line X-X of FIG. 2H, in accordance with some embodiments of the disclosure.

FIG. 2J illustrates a semiconductor structure 100 after the formation of source/drain feature 146, contact etching stop layer 148 and interlayer dielectric layer 150, in accordance with some embodiments. FIG. 2J is a cross-sectional view corresponding to line X-X of FIG. 2H.

Source/drain features 146 are formed over the lower fin elements 103 of the active regions 130A-130D in the source/drain recesses 142 using an epitaxial growth process, as shown in FIG. 2J, in accordance with some embodiments. The epitaxial growth process may be MBE, MOCVD, or VPE, another suitable technique, or a combination thereof. The source/drain features 146 are formed on opposite sides of the dummy gate structures 134, in accordance with some embodiments. The source/drain features 146 abut the second semiconductor layers 106 of the active regions 130A-130D and the inner spacer layers 144, in accordance with some embodiments.

A contact etching stop layer 148 is formed over the semiconductor structure 100 to cover the source/drain features 146, as shown in FIG. 2J, in accordance with some embodiments. The contact etching stop layer 148 is further formed along, and covers, the sidewalls of the gate spacer layers 140 and the top surface of the isolation structure 132, in accordance with some embodiments.

In some embodiments, the contact etching stop layer 148 is made of dielectric material, such as silicon nitride (SiN), silicon oxide (SiO$_2$), silicon oxynitride (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 148 is globally and conformally deposited over the semiconductor structure 100 using CVD (such as LPCVD, PECVD, HDP-CVD, or HARP), ALD, another suitable method, or a combination thereof.

Afterward, an interlayer dielectric layer 150 is formed over the contact etching stop layer 148, as shown in FIG. 2J, in accordance with some embodiments. The interlayer dielectric layer 150 overfills the space between dummy gate structures 134, in accordance with some embodiments. In some embodiments, the interlayer dielectric layer 150 is made of dielectric material, such as un-doped silicate glass (USG), doped silicon oxide such as borophosphosilicate glass (BPSG), fluoride-doped silicate glass (FSG), phosphosilicate glass (PSG), borosilicate glass (BSG), and/or another suitable dielectric material.

In some embodiments, the interlayer dielectric layer 150 and the contact etching stop layer 148 are made of different materials and have a great difference in etching selectivity.

In some embodiments, the dielectric material for the interlayer dielectric layer 150 is deposited using such as CVD (such as HDP-CVD, PECVD, HARP or FCVD), another suitable technique, or a combination thereof. The dielectric materials for the contact etching stop layer 148 and the interlayer dielectric layer 150 above the top surface of the dummy gate electrode layer 138 are removed using such as CMP, in accordance with some embodiments.

Figure 2K:
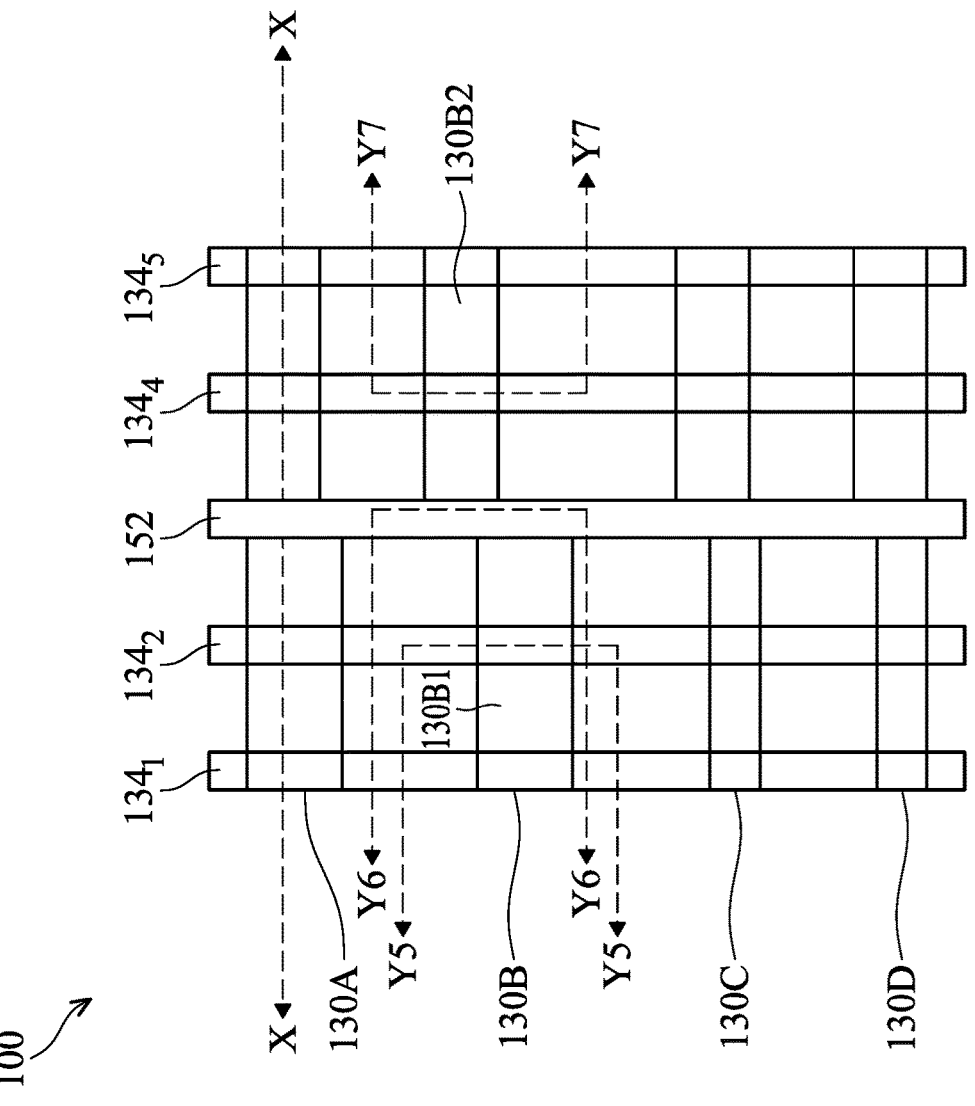
Figures 1, 2K:
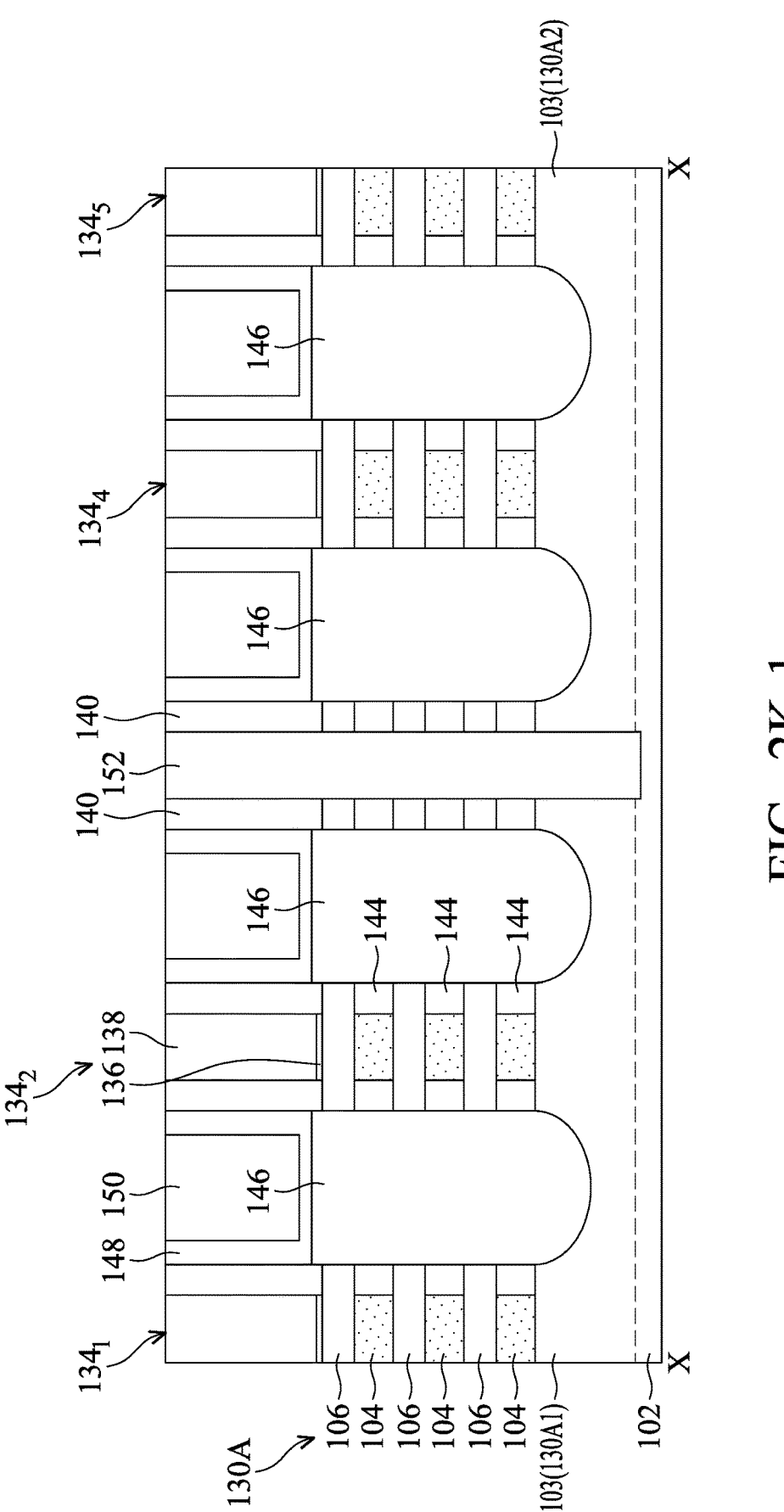
Figures 2, 2K, 3, 4:
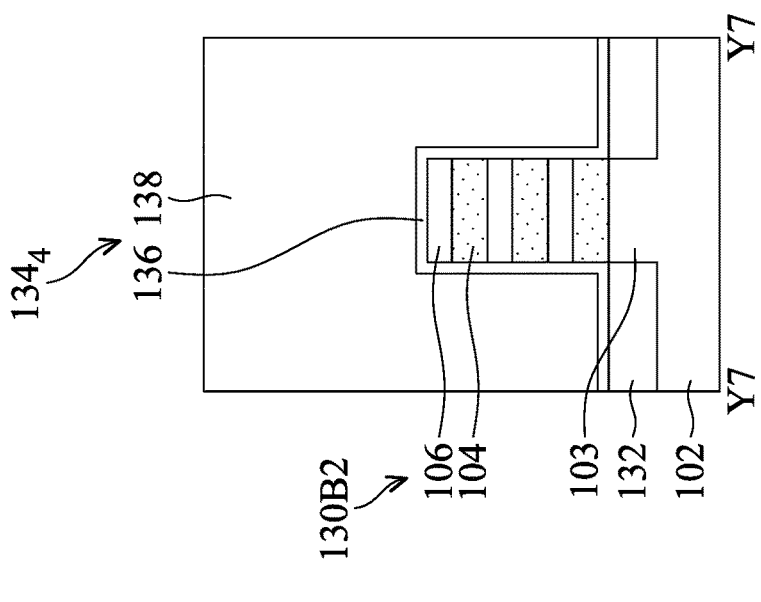
Figures 2, 2K, 3:
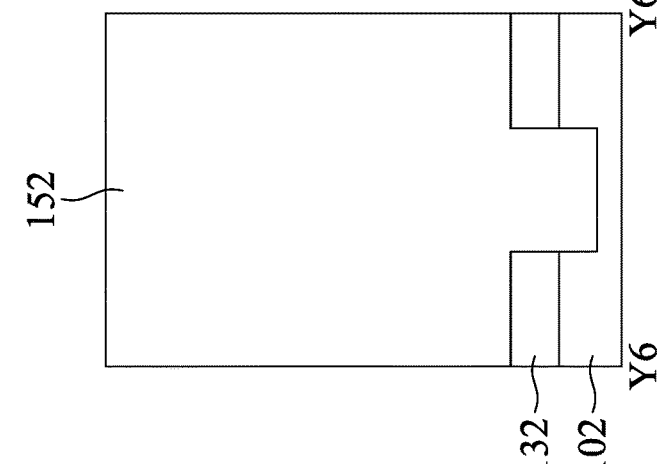
Figures 2, 2K:
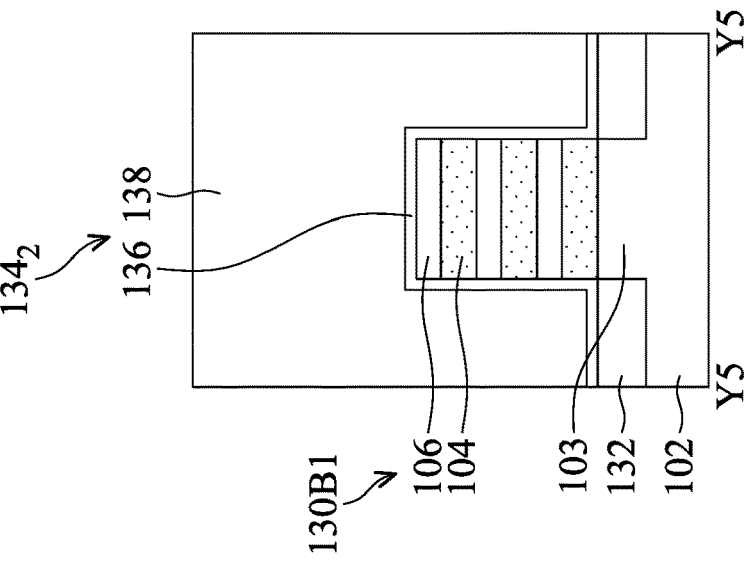
Figures 1, 2L:
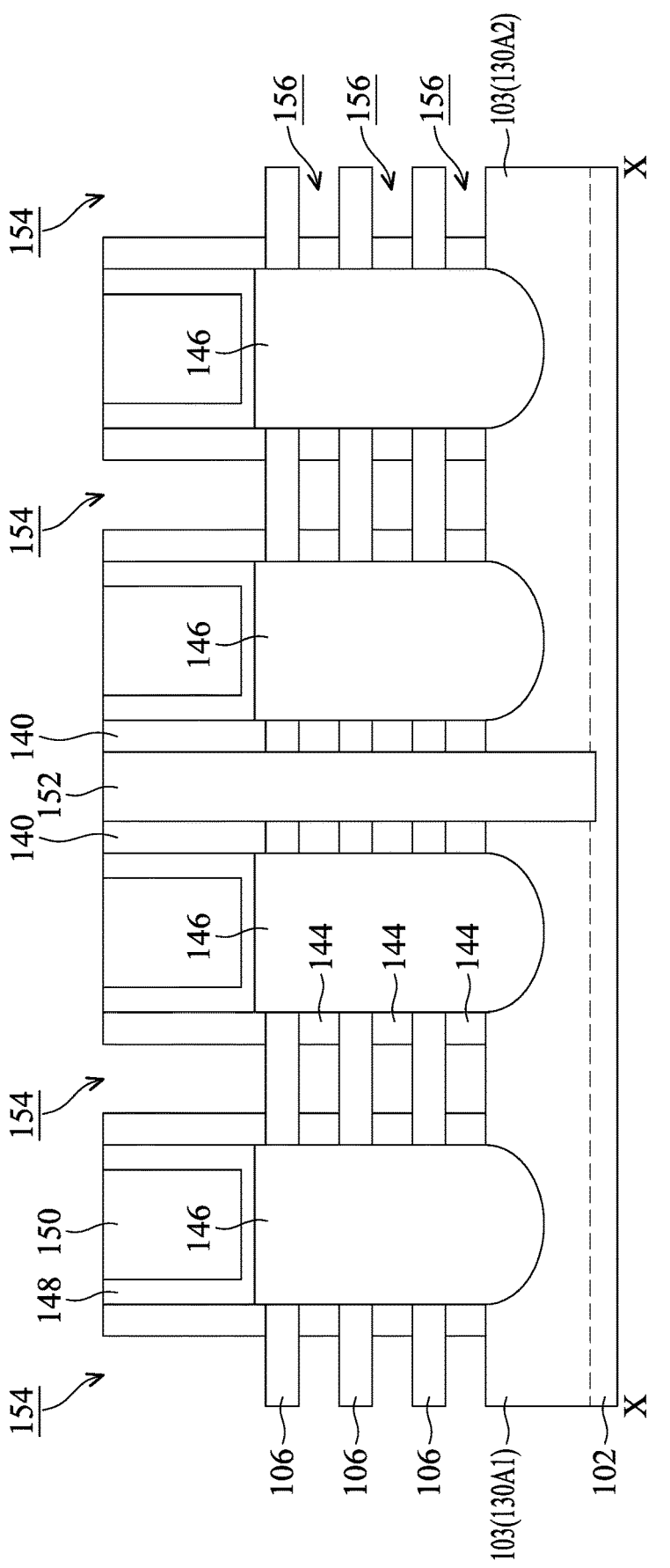
Figures 2, 2L, 3, 4:
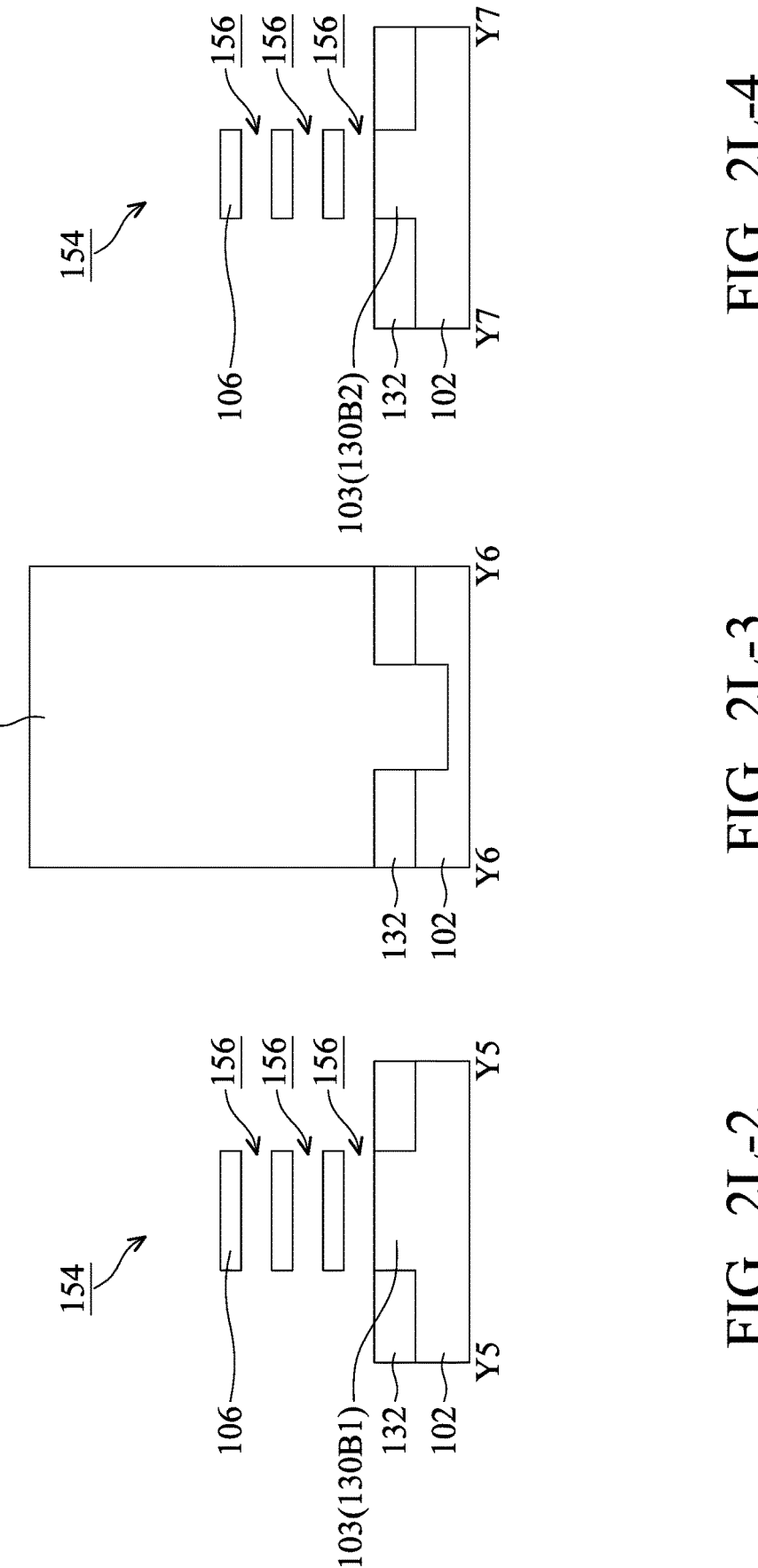

FIGS. 2K through 2K-4 illustrate a semiconductor structure 100 after the formation of a dielectric cutting structure 152. FIG. 2K is a plan view of the semiconductor structure 100. FIGS. 2K-1, 2K-2, 2K-3 and 2K-4 are cross-sectional views corresponding to line X-X, line Y5-Y5, line Y6-Y6 and line Y7-Y7 of FIG. 2K.

A dielectric cutting structure 152 is formed through the dummy gate structure 134 and further through the transition segments of the active regions 130A-130D, as shown in FIGS. 2K, 2K-1 and 2K-3, in accordance with some embodiments. In some embodiments, the dielectric cutting structure 152 extend in the Y direction. That is, the dielectric cutting structure 152 has longitudinal axes parallel to the Y direction, in accordance with some embodiments. The narrower fin segment and the wider fin segment of each of the active regions 130A-130D are physically and electrically isolated from one another, in accordance with some embodiments. In some embodiments, the dielectric cutting structure 152 is configured to prevent leakage between neighboring devices. The dielectric cutting structure 152 may be also referred to as cut poly gate on oxide definition edge (CPODE) pattern.

The dielectric cutting structure 152 is made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide (SiO$_2$), or a combination thereof. In some embodiments, dielectric cutting structure 152 includes dielectric material with k-value greater than 9, such as LaO, AlO, AlON, ZrO, HfO, ZnO, ZrN, ZrAlO, TiO, TaO, YO, and/or TaCN.

The formation of the dielectric cutting structure 152 includes patterning the dummy gate structure 134$_3$ and the transition segments of the active regions 130A-130D to form a cutting trench (where the dielectric cutting structure 152 is to be formed) using photolithography and etching processes. The etch process may include plasma dry etching, another suitable method, or a combination thereof. In some embodiments, the cutting trench extends into the substrate 102 and has bottom surfaces lower than the bottom surface of the isolation structure 132, in accordance with some embodiments.

In the case where the transition portions of the photoresist patterns are transferred into the active regions, the transition segments of the active regions may have a curved sidewall (e.g., smiling profile). After the patterning process for forming the dummy gate structures, the materials for the dummy gate structure may remain on the curved sidewalls. As a result, during the etching process for forming the cutting trench, the source/drain features adjacent to the cutting trench may be easily damaged. In accordance with the embodiments of the present disclosure, the active regions 130A-130D are formed to have smaller transition segments, thereby further improving the manufacturing yield of the resulting semiconductor devices.

The formation of the dielectric cutting structure 152 also includes depositing a dielectric material for the dielectric cutting structure 152 over the semiconductor structure 100 to overfill the cutting trench, in accordance with some embodiments. In some embodiments, the deposition process is ALD, CVD (such as LPCVD, PECVD, HDP-CVD, or HARP), another suitable technique, or a combination thereof. A planarization process is then performed on the semiconductor structure 100 to remove the dielectric material formed above the dummy gate electrode layer 138, in accordance with some embodiments. The planarization may be CMP, etching back process, or a combination thereof.

FIGS. 2L-1, 2L-2, 2L-3 and 2L-4 illustrate a semiconductor structure 100 after the formation of gate trenches 154 and gaps 156, in accordance with some embodiments. FIGS. 2L-1, 2L-2, 2L-3 and 2L-4 are cross-sectional views corresponding to line X-X, line Y5-Y5, line Y6-Y6 and line Y7-Y7 of FIG. 2K.

The dummy gate structures $134_1$, $134_2$, $134_4$ and $134_5$ are removed using an etching process to form gate trenches 154 between the gate spacer layers 140, as shown in FIGS. 2L-1, 2L-2 and 2L-4, in accordance with some embodiments. In some embodiments, the gate trenches 154 expose the channel regions of the active regions 130A-130D. In some embodiments, the gate trenches 154 further expose the sidewalls of the gate spacer layers 140 facing the channel region. In some embodiments, the etching process includes one or more etching processes. For example, when the dummy gate electrode layer 138 is made of polysilicon, a wet etchant such as a tetramethylammonium hydroxide (TMAH) solution may be used to selectively remove the dummy gate electrode layer 138. For example, the dummy gate dielectric layer 136 maybe thereafter removed using a plasma dry etching, a dry chemical etching, and/or a wet etching.

Afterward, an etching process is performed to remove the first semiconductor layers 104 of the active regions 130A-130D to form gaps 156, as shown in FIGS. 2L-1, 2L-2 and 2L-4, in accordance with some embodiments. The inner spacer layers 144 may be used as an etching stop layer in the etching process, which may protect the source/drain features 156 from being damaged. In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

The gaps 156 are formed between adjacent second semiconductor layers 106 and between the lowermost second semiconductor layers 106 and the lower fin element 103, in accordance with some embodiments. In some embodiments, the gaps 156 also expose the sidewalls of the inner spacer layers 144 facing the channel region.

After the one or more etching processes, the four main surfaces of the second semiconductor layers 106 are exposed, in accordance with some embodiments. The exposed second semiconductor layers 106 form nanostructures, in accordance with some embodiments. The nanostructures 106 are vertically stacked and spaced apart from one other, in accordance with some embodiments. As the term is used herein, "nanostructures" refers to the semiconductor layers with cylindrical shape, bar shaped and/or sheet shape. The nanostructures 106 function as channels of the resulting semiconductor devices (e.g., nanostructure transistors such as GAA transistors), in accordance with some embodiments.

Figure 2M:
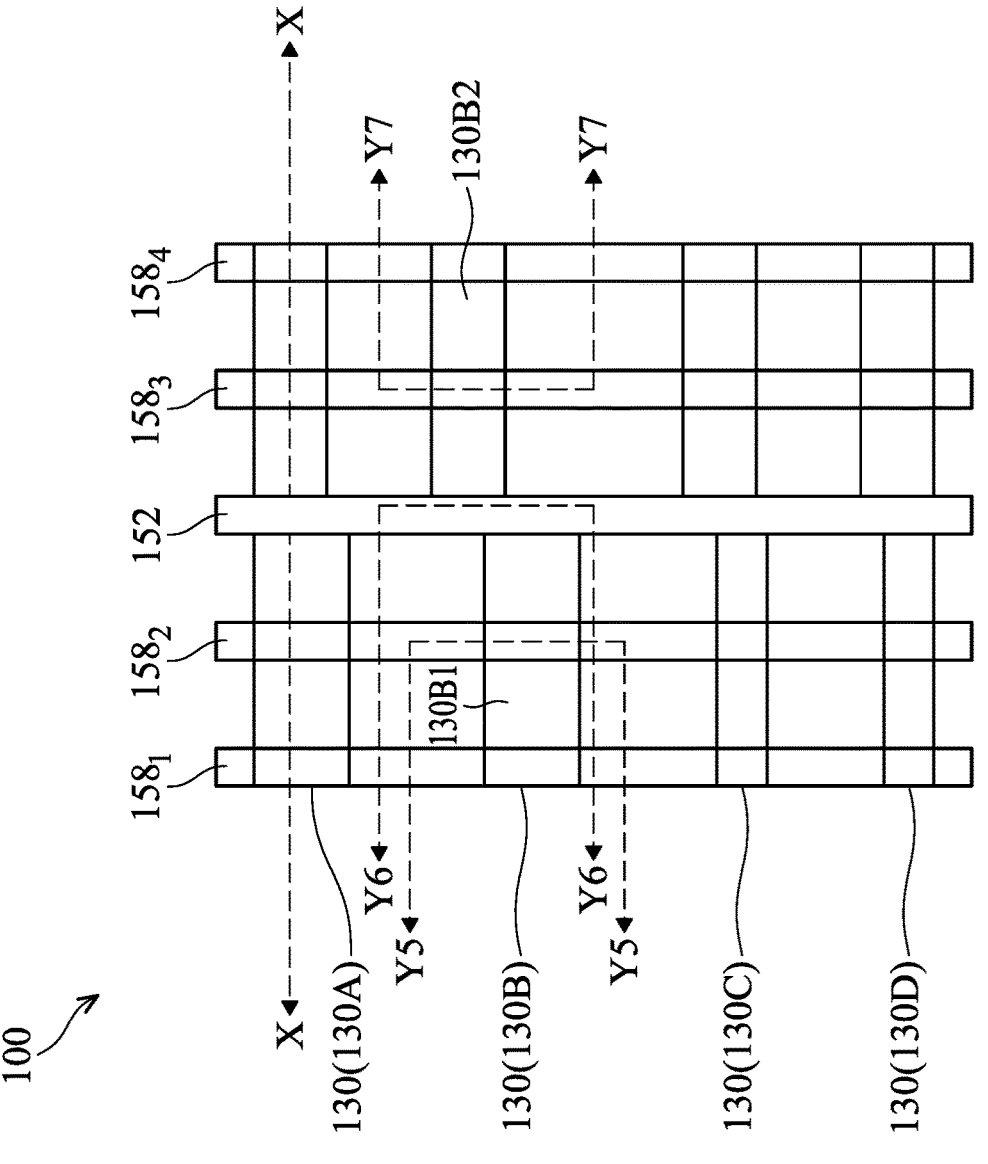
Figures 1, 2M:
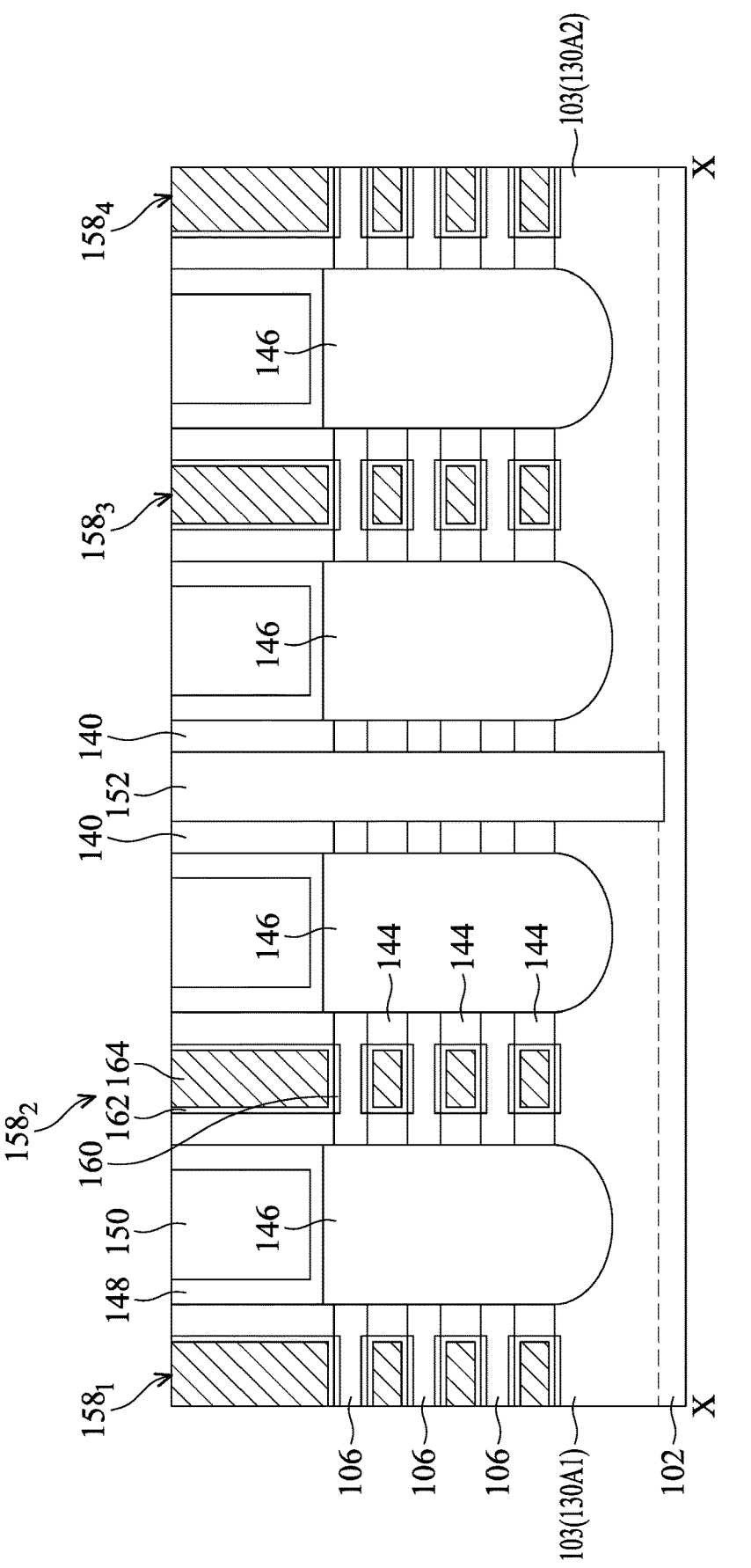
Figures 2, 2M, 3, 4:
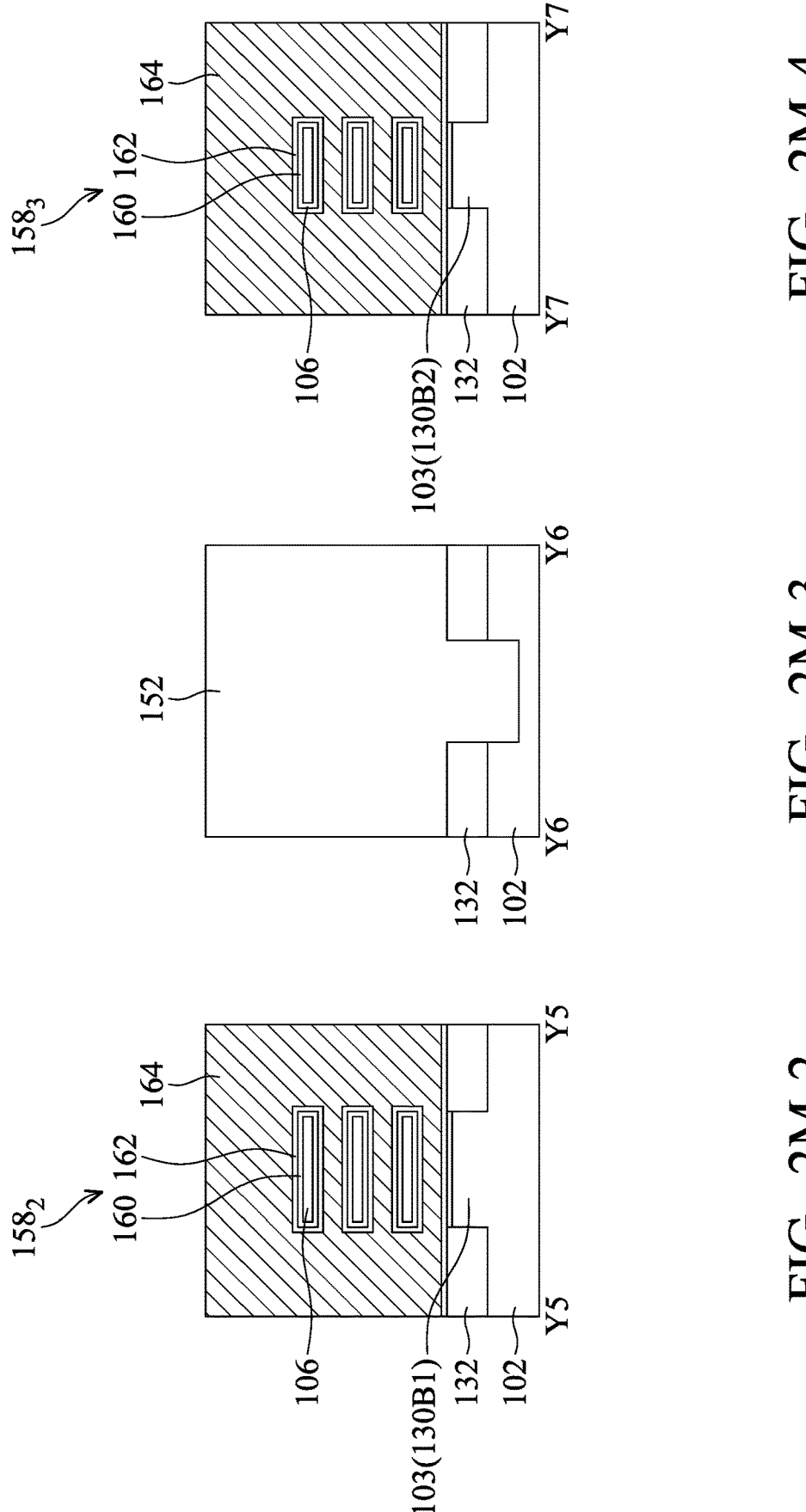
Figures 2, 2M, 3, 4, 5:
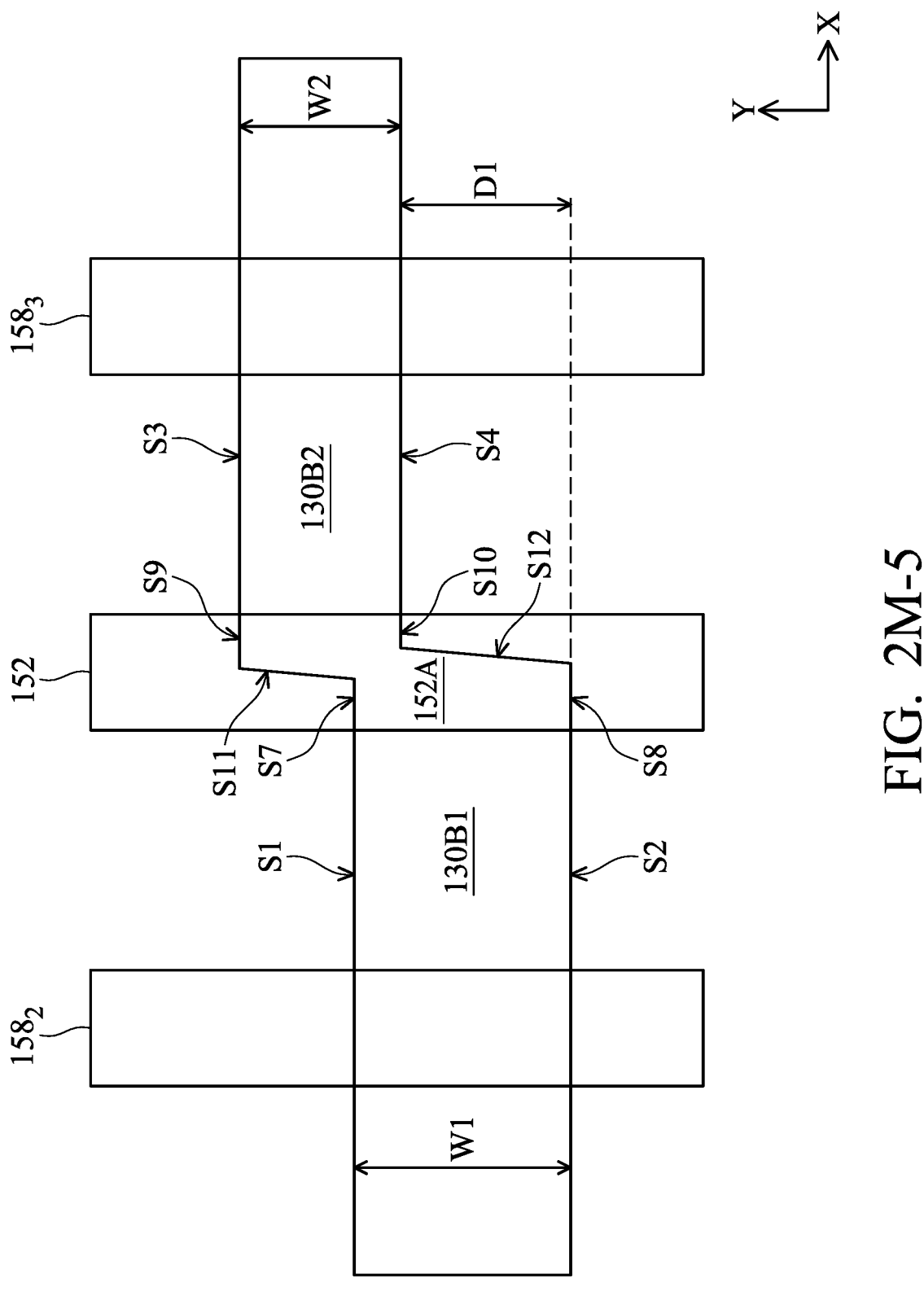

FIGS. 2M through 2M-4 illustrate a semiconductor structure 100 after the formation of final gate stacks 158. FIG. 2M is a plan view of the semiconductor structure 100. FIGS.

2M-1, 2M-2, 2M-3 and 2M-4 are cross-sectional views corresponding to line X-X, line Y5-Y5, line Y6-Y6 and line Y7-Y7 of FIG. 2M.

Final gate stacks 158 (including $158_1$, $158_2$, $158_3$ and $158_4$) are formed in the gate trenches 154 and gaps 156, thereby wrapping around the nanostructures 106, as shown in FIGS. 2M, 2M-1, 2M-2 and 2M-4, in accordance with some embodiments. In some embodiments, the final gate stacks 158 extend in the Y direction. The final gate stacks 158 have longitudinal axes parallel to the Y direction, in accordance with some embodiments. That is, the dimensions (lengths) of the final gate stacks 158 in the Y direction are greater than the dimensions (widths) of the final gate stacks 158 in the X direction. The final gate stacks 158 engage the channel region so that current can flow between the source/drain regions during operation. In some embodiments, each of the final gate stacks 158 includes an interfacial layer 160, a gate dielectric layer 162 and a metal gate electrode layer 164, as shown in FIGS. 2M-1, 2M-2 and 2M-4, in accordance with some embodiments.

The interfacial layer 160 is formed on the exposed surfaces of the nanostructures 106 and the exposed top surfaces of the lower fin elements 103, in accordance with some embodiments. The interfacial layer 160 wraps around the nanostructures 106, in accordance with some embodiments. In some embodiments, the interfacial layer 160 is made of a chemically formed silicon oxide. In some embodiments, the interfacial layer 160 is nitrogen-doped silicon oxide. In some embodiments, the interfacial layer 160 is formed using one or more cleaning processes such as including ozone ($O_3$), ammonia hydroxide-hydrogen peroxide-water mixture, and/or hydrochloric acid-hydrogen peroxide-water mixture. Semiconductor material from the nanostructures 106 and the lower fin elements 103 is oxidized to form the interfacial layer 160, in accordance with some embodiments.

The gate dielectric layer 162 is formed conformally along the interfacial layer 160 to wrap around the nanostructures 106, in accordance with some embodiments. The gate dielectric layer 162 is also conformally formed along the sidewalls of the gate spacer layers 140 facing the channel region, in accordance with some embodiments. The gate dielectric layer 162 is also conformally formed along the sidewalls of the inner spacer layers 144 facing the channel region, in accordance with some embodiments. The gate dielectric layer 162 is further formed along the top surface of the isolation structure 132, in accordance with some embodiments.

The gate dielectric layer 162 may be high-k dielectric layer. In some embodiments, the high-k dielectric layer is dielectric material with high dielectric constant (k value), for example, greater than 9, such as greater than 13. In some embodiments, the high-k dielectric layer includes hafnium oxide ($HfO_2$), $TiO_2$, $HfZrO$, $Ta_2O_3$, $HfSiO_4$, $ZrO_2$, $ZrSiO_2$, $LaO$, $Al_2O_3$, $ZrO$, $TiO$, $Ta_2O_5$, $Y_2O_3$, $SrTiO_3$ (STO), $BaTiO_3$ (BTO), $BaZrO$, $HfZrO$, $HfLaO$, $HfSiO$, $LaSiO$, $AlSiO$, $HfTaO$, $HfTiO$, $(Ba,Sr)TiO_3$ (BST), $Si_3N_4$, oxynitrides (SiON), a combination thereof, or another suitable material. The high-k dielectric layer may be deposited using ALD, PVD, CVD, and/or another suitable technique.

The metal gate electrode layer 164 is formed to fill remainders of the gate trenches 154 and gaps 156, in accordance with some embodiments. In some embodiments, the metal gate electrode layer 164 is made of more than one conductive material, such as a metal, metal alloy, conductive metal oxide and/or metal nitride, another suitable conductive material, and/or a combination thereof. For example, the metal gate electrode layer 164 may be made of Ti, Ag, Al, TiAlN, TaC, TaCN, TaSiN, Mn, Zr, TiN, TaN, Ru, Mo, WN, Cu, W, Re, Ir, Co, Ni, another suitable conductive material, or multilayers thereof.

The metal gate electrode layer 164 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 164 may be formed using ALD, PVD, CVD, e-beam evaporation, or another suitable technique.

A planarization process such as CMP may be performed on the semiconductor structure 100 to remove the materials of the gate dielectric layer 162 and the metal gate electrode layer 164 formed above the top surface of the interlayer dielectric layer 150, in accordance with some embodiments. The final gate stacks 158 wrapping around the nanostructures 106 combine with the neighboring source/drain features 146 to form nanostructure transistors, in accordance with some embodiments.

FIG. 2M-5 is an enlarged view of FIG. 2M to illustrate more detail of an active region 130B and neighboring components, in accordance with some embodiments of the disclosure.

The dielectric cutting structure 152 includes a portion 152A extending between the fin segment 130B1 and fin segment 130B2 of the active region 130B, as shown in FIG. 2M-5, in accordance with some embodiments. The portion 152A has sidewalls S7 and S8 extending in the X direction and connecting to the sidewalls S1 and S2 of the fin segment 130B1, in accordance with some embodiments. The portion 152A also has sidewalls S9 and S10 extending in the X direction and connecting to the sidewalls S3 and S4 of the fin segment 130B2, in accordance with some embodiments. The portion 152A also has sidewalls S11 and S12 extending in or approximately in the Y direction, in accordance with some embodiments. The sidewall S7 is connected to the sidewall S9 through the sidewall S11, in accordance with some embodiments. In some embodiments, the angle between the sidewall S7 and the sidewall S11 is a right angle (i.e., 90 degrees) or an approximately right angle of from about 90 degrees to about 95 degrees. The sidewall S8 is connected to the sidewall S10 by a sidewall S12, in accordance with some embodiments. In some embodiments, the angle between the sidewall S10 and the sidewall S12 is a right angle (i.e., 90 degrees) or an approximately right angle of from about 90 degrees to about 95 degrees.

It should be understood that the semiconductor structure 100 may undergo further CMOS processes to form various features over the semiconductor structure, such as a multilayer interconnect structure (e.g., contact plugs to final gate stacks and source/drain features, conductive vias, metal lines, inter metal dielectric layers, passivation layers, etc.). In some embodiments, the device formed over the wider fin segment may be electrically connected to the device formed over the narrower fin segment through the conductive features of the multilayer interconnect structure.

Figures 3A, 3B:
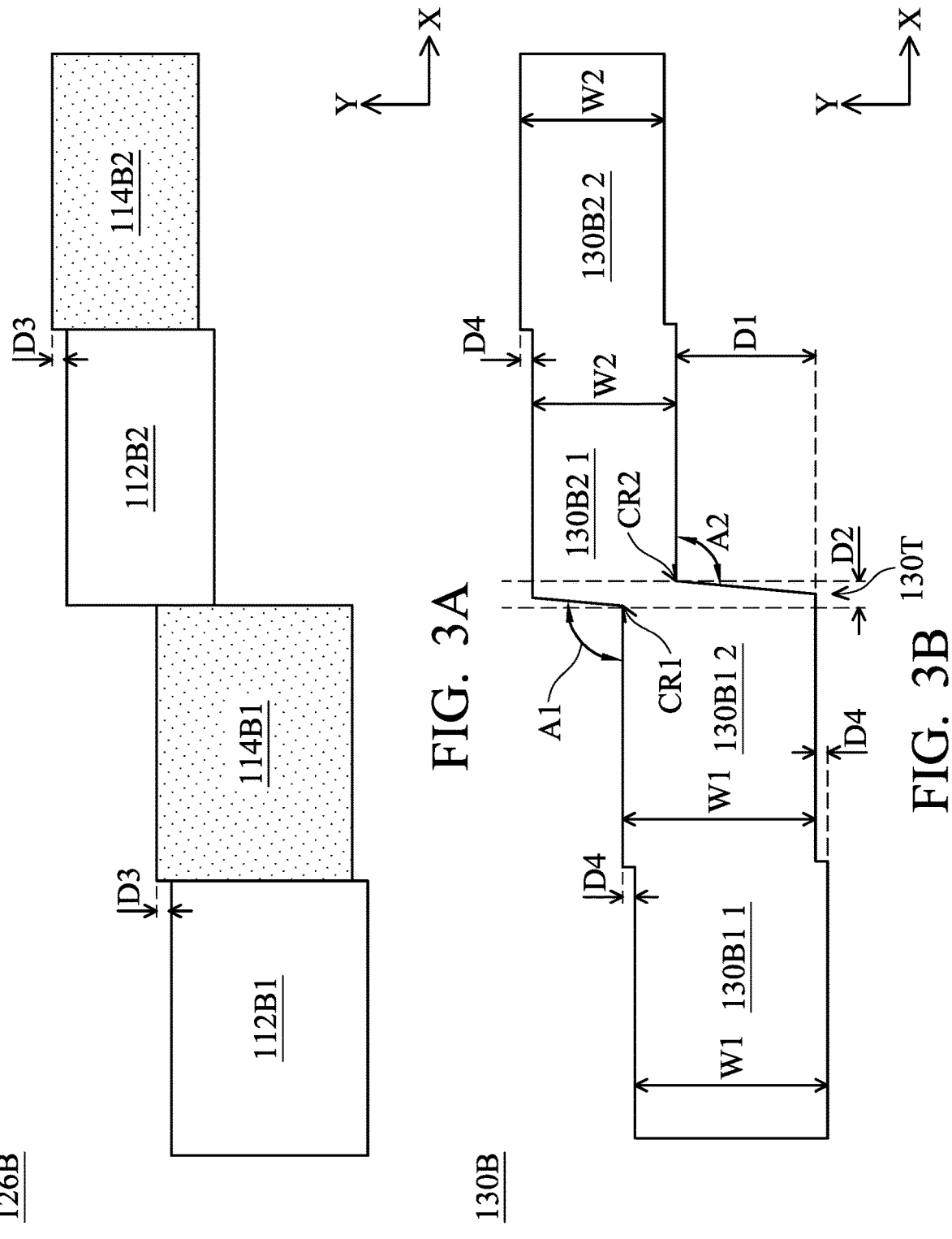
FIGS. 3A-3C are plan views illustrating the formation of a semiconductor structure at various intermediate, in accordance with some embodiments of the disclosure.
Figure 3C:
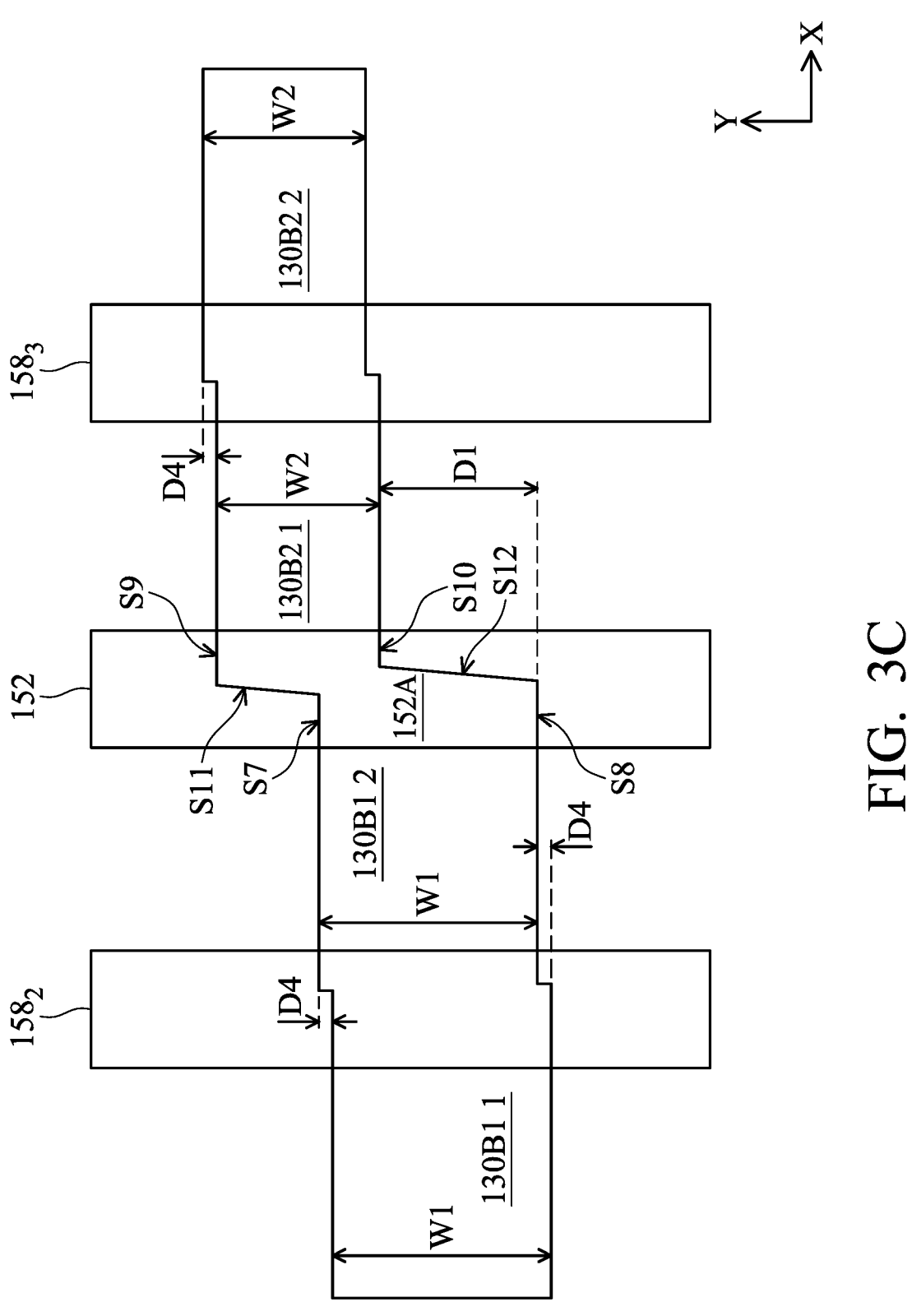

FIGS. 3A-3C are plan views illustrating the formation of a semiconductor structure at various intermediate stages, in accordance with some embodiments of the disclosure. The embodiments of FIGS. 3A-3C are similar to the embodiments of FIGS. 2A through 2M-5, except that the island pattern 114B1 is offset from the island pattern 112B1, and the island pattern 114B2 is offset from the island pattern 112B2.

FIG. 3A illustrates a semiconductor structure after the formation of the hard mask pattern 126B, in accordance with some embodiments. In some embodiments, the locations of the second photoresist patterns 124A, 124B, 124C and 124D (FIG. 2E) may be offset from the locations of the first photoresist patterns 118A, 118B 118C and 118D (FIG. 2C) in the Y direction. As a result, the island pattern 114B1 is offset from the island pattern 114A1 in the Y direction by a distance D3, and the island pattern 114B2 is offset from the island pattern 114A2 in the Y direction by the distance D3. In some embodiments, the distance D3 is in a range from about 1 nm to about 4.5 nm. In some embodiments, the sidewalls of the island patterns 112B1 and 114B1 with respect to the Y direction (extending in the X direction) are not aligned with each other, in accordance with some embodiments. In some embodiments, the sidewalls of the island patterns 112B2 and 114B2 with respect to the Y direction (extending in the X direction) are not aligned with each other, in accordance with some embodiments.

FIG. 3B illustrates a semiconductor structure after the formation of the active region 130B, in accordance with some embodiments. The hard mask pattern 126B is transferred into the epitaxial stack and the substrate 102, thereby forming the active region 130B, in accordance with some embodiments. In some embodiments, the active regions 130B includes a wider fin segment 130B1 and a narrower fin segment 130B1.

In some embodiments, the wider fin segment 130B1 includes a first portion 130B1_1 (transferred from the island pattern 112B1) and a second portion 130B1_2 (transferred from the island pattern 114B1). In some embodiments, the second portion 130B1_2 is offset from the first portion 130B1_1 in the Y direction by the distance D4. In some embodiments, the narrower fin segment 130B1 includes a third portion 130B2_1 (transferred from the island pattern 112B2) and a fourth portion 130B2_2 (transferred from the island pattern 114B2). In some embodiments, the fourth portion 130B2_2 is offset from the third portion 130B2_1 in the Y direction by the distance D4. In some embodiments, the distance D4 is in a range from about 1 nm to about 4.5 nm.

FIG. 3C illustrates a semiconductor structure after the formation of the final gate stacks 158, in accordance with some embodiments. The dielectric cutting structure 152 is formed through the dummy gate structure 134₃ and the transition segments 130T of the active region 130B, in accordance with some embodiments. The narrower fin segment 130B2 and the wider fin segment 130B1 of the active regions 130B are physically and electrically isolated from one another by the dielectric cutting structure 152, in accordance with some embodiments. The final gate stacks 158 replace the dummy gate structures 134 and wrap around the nanostructures 106, in accordance with some embodiments.

Figures 4A, 4B:
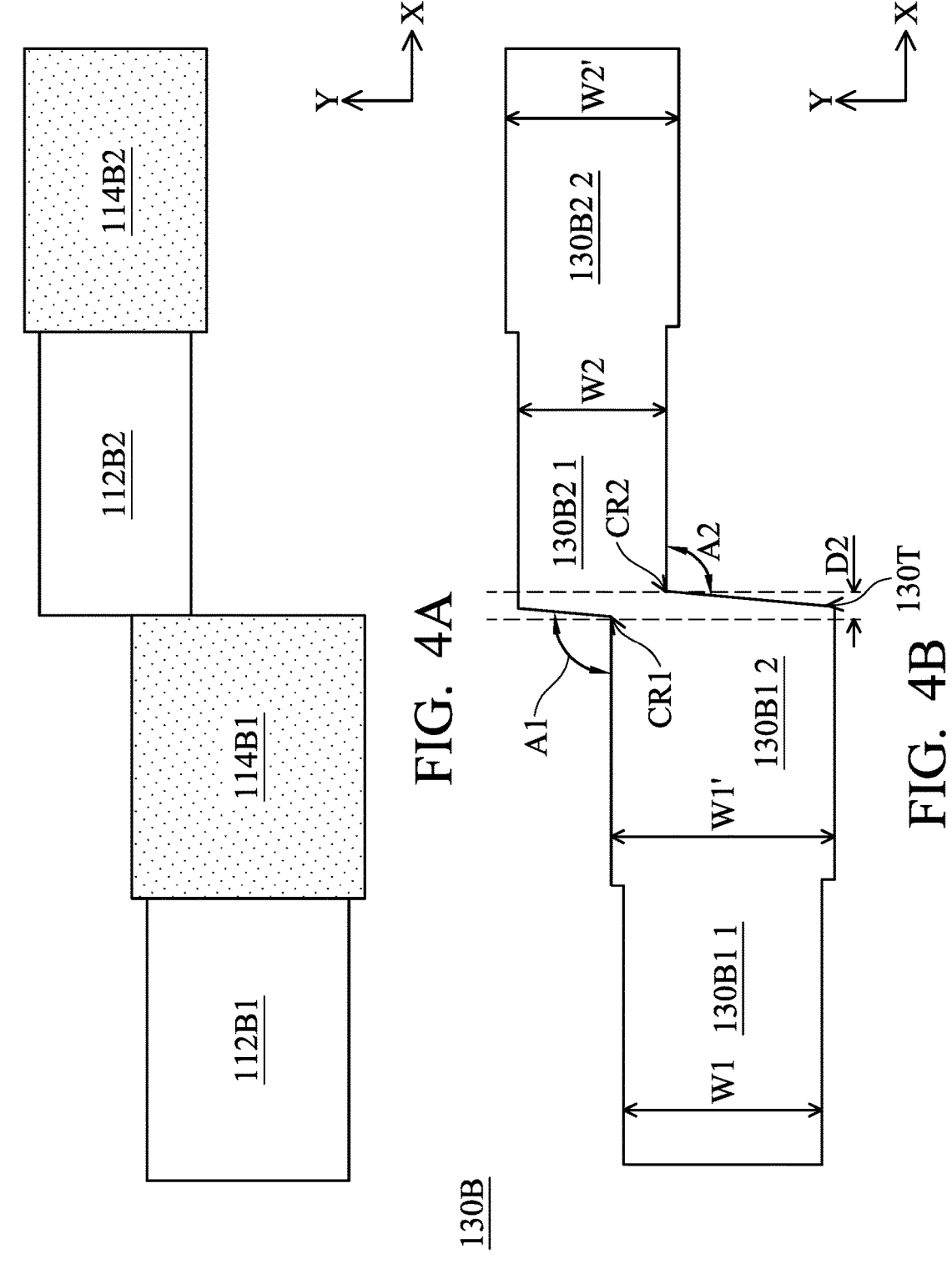
FIGS. 4A-4C are plan views illustrating the formation of a semiconductor structure at various intermediate, in accordance with some embodiments of the disclosure.
Figure 4C:
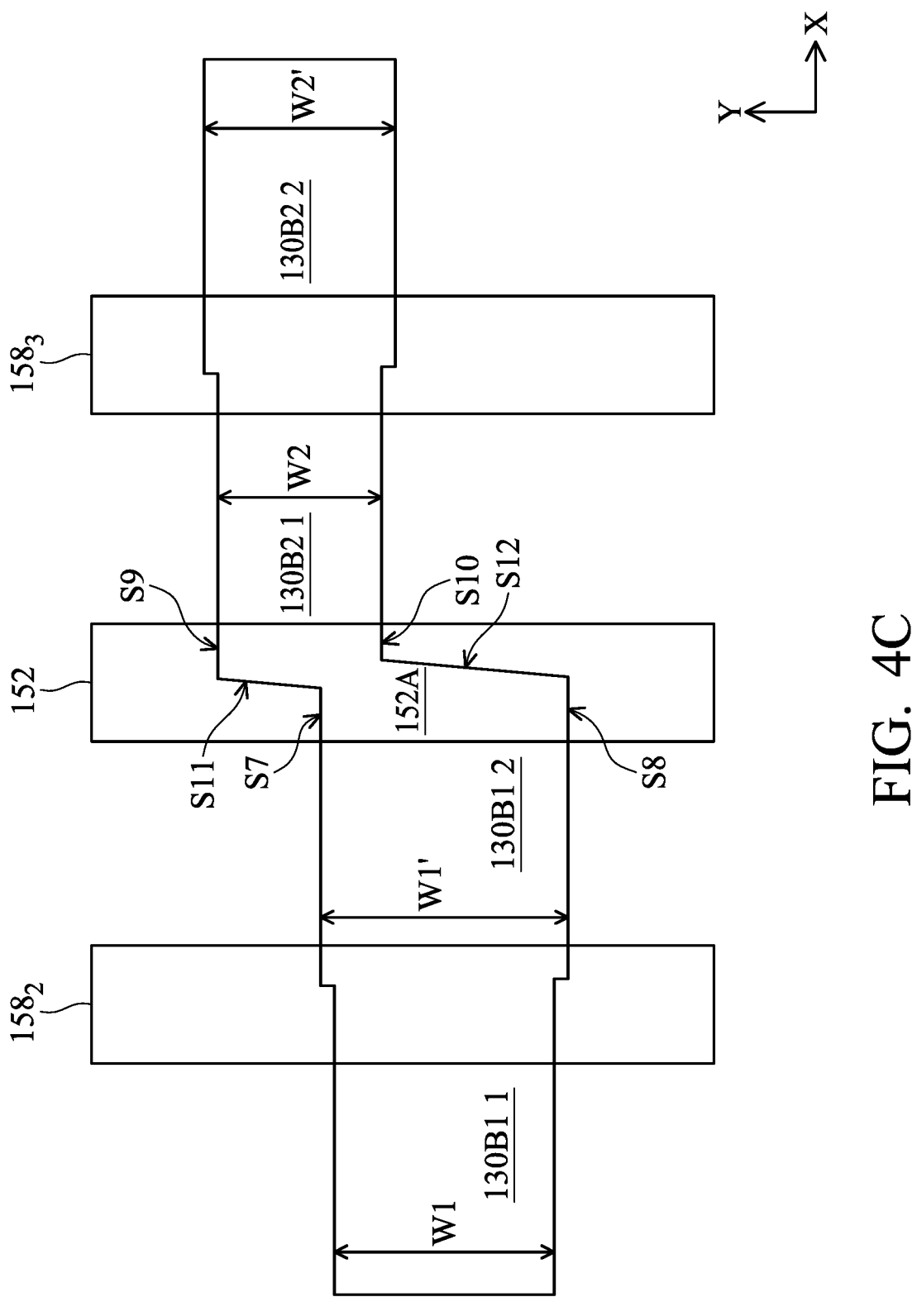

FIGS. 4A-4C are plan views illustrating the formation of a semiconductor structure at various intermediate stages, in accordance with some embodiments of the disclosure. The embodiments of FIGS. 4A-4C are similar to the embodiments of FIGS. 2A through 2M-5, except that the island pattern 114B1 is wider than the island pattern 112B1, and the island pattern 114B2 is wider than the island pattern 112B2.

FIG. 4A illustrates a semiconductor structure after the formation of the hard mask pattern 126B, in accordance with some embodiments. In some embodiments, the dimensions of the second photoresist patterns 124A, 124B, 124C and 124D (FIG. 2E) in the Y direction may be greater from the dimensions of the first photoresist patterns 118A, 118B 118C and 118D (FIG. 2C) in the Y direction. As a result, the island pattern 114B1 is wider than the island pattern 112B1 in the Y direction, and the island pattern 114B2 is wider than the island pattern 112B2 in the Y direction.

FIG. 4B illustrates a semiconductor structure after the formation of the active region 130B, in accordance with some embodiments. The hard mask pattern 126B is transferred into the epitaxial stack and the substrate 102, thereby forming the active region 130B, in accordance with some embodiments. In some embodiments, the active regions 130B includes a wider fin segment 130B1 and a narrower fin segment 130B1.

In some embodiments, the wider fin segment 130B1 includes a first portion 130B1_1 (transferred from the island pattern 112B1) and a second portion 130B1_2 (transferred from the island pattern 114B1). In some embodiments, the width W1' of the second portion 130B1_2 is greater than the width W1 of the first portion 130B1_1. In some embodiments, the narrower fin segment 130B1 includes a third portion 130B2_1 (transferred from the island pattern 112B2) and a fourth portion 130B2_2 (transferred from the island pattern 114B2). In some embodiments, the width W2' of the fourth portion 130B2_2 is wider than the width W2 of the third portion 130B2_1. In some embodiments, the width W2' is less than the width W1.

FIG. 4C illustrates a semiconductor structure after the formation of the final gate stacks 158, in accordance with some embodiments. The dielectric cutting structure 152 is formed through the dummy gate structure 134₃ and the transition segments 130T of the active region 130B, in accordance with some embodiments. The narrower fin segment 130B2 and the wider fin segment 130B1 of the active regions 130B are physically and electrically isolated from one another by the dielectric cutting structure 152, in accordance with some embodiments. The final gate stacks 158 replace the dummy gate structures 134 and wrap around the nanostructures 106, in accordance with some embodiments.

As described above, the aspect of the present disclosure is directed to forming an active region with segments of different widths. The hard mask patterns 126A-126D for forming the active regions 130A-130D are formed by patterning the strip patterns 112 and 114 with a great difference in etching selectivity using two photolithography processes. As a result, the transition portions TR of the photoresist patterns 118 and 124 may be not transferred into the active regions 130A-130D. Therefore, the circuit density of the resulting semiconductor device may be improved. Furthermore, the power consumption of the resulting semiconductor devices may be reduced, and the performance of the resulting semiconductor devices may be enhanced.

Embodiments of a semiconductor structure and a method for forming the same are provided. The method may include forming alternating first strip patterns and second strip patterns over an epitaxial stack, patterning first strip patterns to form a first island pattern and a second island pattern, patterning second strip patterns to form a third island pattern and a fourth island pattern, and patterning an epitaxial stack using the first to fourth island patterns to form an active region. As a result, the transition portion of the photoresist pattern may be not transferred into active region. Therefore, the circuit density of the resulting semiconductor device may be improved.

In some embodiments, a method for forming a semiconductor structure is provided. The method includes forming an epitaxial stack over a substrate, and forming a first plurality of strip patterns and a second plurality of strip patterns that extend over the epitaxial stack in a first horizontal direction and are alternately arranged in a second horizontal direction perpendicular to the first horizontal direction. The method further includes patterning the first plurality of strip patterns to form a first plurality of island patterns, and patterning the second plurality of strip patterns to form a second plurality of island patterns. The first plurality of island patterns and the second plurality of island patterns are alternately arranged in the second horizontal direction. The method further includes etching the epitaxial stack and the substrate using the first plurality of island patterns and second plurality of island patterns, thereby forming a fin structure.

In some embodiments, a method for forming a semiconductor structure is provided. The method includes forming a mask layer over a semiconductor layer. The mask layer includes first, second, third and fourth strip patterns which are arranged sequentially in a first horizontal direction. The method further includes forming a first photoresist pattern over the mask layer, and removing portions of the first and third strip patterns uncovered by the first photoresist pattern. A remaining portion of the first strip pattern and a remaining portion of the third strip pattern form a first island pattern and a second island pattern, respectively. The method further includes forming a second photoresist pattern over the mask layer after forming the first and the second island patterns, and removing portions of the second and fourth strip patterns uncovered by the second photoresist pattern. A remaining portion of the second strip pattern and a remaining portion of the fourth strip pattern form a third island pattern and a fourth island pattern, respectively. The method further includes patterning the semiconductor layer using the first to fourth island patterns to form a fin structure, and forming a plurality of gate structures over the fin structure.

In some embodiments, a semiconductor structure is provided. The semiconductor structure includes a first fin segment extending in a first horizontal direction and having a first width in a second horizontal direction perpendicular to the first horizontal direction. The semiconductor structure further includes a second fin segment extending in the first horizontal direction and having a second width in the second horizontal direction. The second width is less than the first width. The semiconductor structure further includes a dielectric cutting structure extending between the first fin segment and a second fin segment, a first set of nanostructures and a second set of nanostructures above the first fin segment and the second fin segment, respectively, and a first gate stack and a second gate stack respectively wrapping around the first set of nanostructures and the second set of nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming an epitaxial stack over a substrate;

forming a first plurality of strip patterns and a second plurality of strip patterns that extend over the epitaxial stack in a first horizontal direction and are alternately arranged in a second horizontal direction perpendicular to the first horizontal direction;

patterning the first plurality of strip patterns to form a first plurality of island patterns;

patterning the second plurality of strip patterns to form a second plurality of island patterns, wherein the first plurality of island patterns and the second plurality of island patterns are alternately arranged in the second horizontal direction; and etching the epitaxial stack and the substrate using the first plurality of island patterns and second plurality of island patterns, thereby forming a fin structure.

2. The method for forming the semiconductor structure as claimed in claim 1, wherein the first plurality of strip patterns includes a first strip pattern and a second strip pattern, the second plurality of strip patterns includes a third strip pattern and a fourth strip pattern, the first strip pattern, and the third strip pattern, the second strip pattern and the fourth strip pattern are sequentially arranged in the second horizontal direction.

3. The method for forming the semiconductor structure as claimed in claim 2, wherein patterning the first plurality of strip patterns comprises:

forming a first photoresist pattern which includes a first middle portion directly above the first strip pattern, a second middle portion directly above the second strip pattern, and a first transition portion directly above the third strip pattern and connecting the first middle portion to the second middle portion, wherein a first dimension of the first middle portion in the first horizontal direction is different than a second dimension of the second middle portion in the first horizontal direction; and etching the first plurality of strip patterns using the first photoresist pattern.

4. The method for forming the semiconductor structure as claimed in claim 3, wherein:

a portion of the first strip pattern directly below the first middle portion of the first photoresist pattern forms a first island pattern in the first plurality of island patterns, and a portion of the second strip pattern directly below the second middle portion of the first photoresist pattern forms a second island pattern in the first plurality of island patterns.

5. The method for forming the semiconductor structure as claimed in claim 4, wherein patterning the second plurality of strip patterns comprises:

forming a second photoresist pattern after etching the first plurality of strip patterns, the second photoresist pattern including a third middle portion directly above the third strip pattern, a fourth middle portion directly above the fourth strip pattern, and a second transition portion directly above the second island pattern and connecting the third middle portion to the fourth middle portion, wherein a third dimension of the third middle portion in the first horizontal direction is different than a fourth dimension of the fourth middle portion in the first horizontal direction; and etching the second plurality of strip patterns using the second photoresist pattern.

6. The method for forming the semiconductor structure as claimed in claim 5, wherein:

a portion of the third strip pattern directly below the third middle portion of the second photoresist pattern forms a third island pattern in the second plurality of island patterns, and a portion of the fourth strip pattern directly below the fourth middle portion of the second photoresist pattern forms a fourth island pattern in the second plurality of island patterns.

7. The method for forming the semiconductor structure as claimed in claim 6, wherein the third island pattern is in direct contact with the first island pattern and the second island pattern.

8. The method for forming the semiconductor structure as claimed in claim 5, wherein the fin structure includes a first fin segment, a second fin segment and a transition segment connecting the first fin segment to the second fin segment, wherein a first dimension of the first fin segment in the first horizontal direction is different than a second dimension of the second fin segment in the first horizontal direction.

9. The method for forming the semiconductor structure as claimed in claim 8, comprising:

forming a plurality of dummy gate structures across the fin structure, wherein the plurality of dummy gate structures includes a first dummy gate structure over the first fin segment, a second dummy gate structure over the transition segment, and a third dummy gate structure over the second fin segment; and replacing the second dummy gate structure with a dielectric cutting structure; and replacing the first dummy gate structure and the third dummy gate structure with a first final gate stack and a second final gate stack, respectively.

10. A method for forming a semiconductor structure, comprising:

forming a mask layer over a semiconductor layer, wherein the mask layer includes first, second, third and fourth strip patterns which are arranged sequentially in a first horizontal direction;

forming a first photoresist pattern over the mask layer;

removing portions of the first and third strip patterns uncovered by the first photoresist pattern, wherein a remaining portion of the first strip pattern and a remaining portion of the third strip pattern form a first island pattern and a second island pattern, respectively;

forming a second photoresist pattern over the mask layer after forming the first and the second island patterns;

removing portions of the second and fourth strip patterns uncovered by the second photoresist pattern, wherein a remaining portion of the second strip pattern and a remaining portion of the fourth strip pattern form a third island pattern and a fourth island pattern, respectively;

patterning the semiconductor layer using the first to fourth island patterns to form a fin structure; and forming a plurality of gate structures over the fin structure.

11. The method for forming the semiconductor structure as claimed in claim 10, wherein the first and third strip patterns are made of a first material, and the second and fourth strip patterns are made of a second material that is different than the first material.

12. The method for forming the semiconductor structure as claimed in claim 10, wherein the first island pattern is wider than second island pattern in a second horizontal direction perpendicular to the first horizontal direction.

13. The method for forming the semiconductor structure as claimed in claim 10, wherein the second island pattern is offset from the first island pattern in a second horizontal direction perpendicular to the first horizontal direction, and the fourth island pattern is offset from the third island pattern in the second horizontal direction.

14. The method for forming the semiconductor structure as claimed in claim 10, wherein:

the first island pattern has a first dimension in a second horizontal direction perpendicular to the first horizontal direction, the second island pattern has a second dimension in the second horizontal direction, and the second dimension is greater than the first dimension.

15. The method for forming the semiconductor structure as claimed in claim 10, wherein in a plan view, the fin structure has a first sidewall extending in the first horizontal direction, a second sidewall extending in the first horizontal direction and offset from the first sidewall, and a third sidewall in connection with the first sidewall and the second sidewall, and an angle between the second sidewall and the third sidewall is in a range from about 90 degrees and 95 degrees.

16. The method for forming the semiconductor structure as claimed in claim 15, wherein in a plan view, one of the gate structures overlaps the third sidewall of the fin structure.

17. A semiconductor structure, comprising:

a first fin segment extending in a first horizontal direction and having a first width in a second horizontal direction perpendicular to the first horizontal direction;

a second fin segment extending in the first horizontal direction and having a second width in the second horizontal direction, wherein the second width is less than the first width;

a dielectric structure between the first fin segment and a second fin segment;

a first set of nanostructures and a second set of nanostructures above the first fin segment and the second fin segment, respectively; and a first gate stack and a second gate stack wrapping around the first set of nanostructures and the second set of nanostructures, respectively, wherein the first gate stack and the second gate stack extend lengthwise along the second horizontal direction, and the dielectric structure extends lengthwise along the second horizontal direction and is separated from the first gate stack and the second gate stack.

18. The semiconductor structure as claimed in claim 17, wherein in a plan view, the first fin segment has a first sidewall extending in the first horizontal direction, the second fin segment has a second sidewall extending in the first horizontal direction, and the second sidewall is offset from the first sidewall by a first distance that is less than the first width of the first fin segment.

19. The semiconductor structure as claimed in claim 18, further comprising:

an isolation structure surrounding the first fin segment and the second fin segment, wherein a bottom surface of the dielectric structure is lower than a bottom surface of the isolation structure.

20. The semiconductor structure as claimed in claim 17, wherein the dielectric structure is in direct contact with the first fin segment and the second fin segment.

* * * * *